(12) United States Patent
Fujino et al.

(10) Patent No.: US 7,541,615 B2
(45) Date of Patent: Jun. 2, 2009

(54) DISPLAY DEVICE INCLUDING THIN FILM TRANSISTORS

(75) Inventors: Toshio Fujino, Kanagawa (JP); Akio Machida, Kanagawa (JP); Tadahiro Kono, Tokyo (JP)

(73) Assignee: Sony Corporation, Tokyo (JP)

( * ) Notice: Subject to any disclaimer, the term of this patent is extended or adjusted under 35 U.S.C. 154(b) by 14 days.

(21) Appl. No.: 11/753,949

(22) Filed: May 25, 2007

(65) Prior Publication Data

US 2007/0290209 A1 Dec. 20, 2007

(30) Foreign Application Priority Data

May 25, 2006 (JP) ............................. 2006-144847
Dec. 21, 2006 (JP) ............................. 2006-344131

(51) Int. Cl.
*H01L 29/10* (2006.01)
(52) U.S. Cl. .................. 257/66; 257/291; 438/166; 438/149
(58) Field of Classification Search .................. 438/150, 438/166, 161, 149; 257/66, 291
See application file for complete search history.

(56) References Cited

U.S. PATENT DOCUMENTS

| | | | |
|---|---|---|---|
| 5,981,974 A | 11/1999 | Makita | |
| 2004/0144988 A1 | 7/2004 | Jung | |
| 2004/0245526 A1 | 12/2004 | Park et al. | |
| 2005/0142050 A1 | 6/2005 | Jung et al. | |
| 2005/0173752 A1 | 8/2005 | Chung et al. | |
| 2006/0079033 A1 | 4/2006 | Machida et al. | |

FOREIGN PATENT DOCUMENTS

| | | |
|---|---|---|
| EP | 1 317 002 | 6/2003 |
| EP | 1 455 396 | 9/2004 |
| EP | 1 551 059 | 7/2005 |
| JP | 2003-77834 | 3/2003 |
| JP | 2003-332350 | 11/2003 |
| JP | 2006-100661 | 4/2006 |

OTHER PUBLICATIONS

Voutsas et al., "Effect of parameters on the structural characteristics of laterally grown, laser-annealed polycrystalline silicon films," vol. 94, pp. 7445-7452, 2003.

(Continued)

*Primary Examiner*—Wael Fahmy
*Assistant Examiner*—Eva Y. Montalvo
(74) *Attorney, Agent, or Firm*—K&L Gates LLP

(57) ABSTRACT

A display including a driving substrate is provided. Arrayed on the driving substrate is a plurality of pixel electrodes and thin film transistors for driving the pixel electrodes. Each thin film transistor includes a semiconductor thin film having an active region made to be polycrystalline by irradiation with an energy beam, and a gate electrode provided so as to cross the active region. In a channel part of the active region overlapping with the gate electrode, the crystal state is varied periodically along the channel length direction, and substantially the same crystal state crosses the channel part.

5 Claims, 10 Drawing Sheets

OTHER PUBLICATIONS

Jeon et al., "A New Poly-Si TFT With Selectively Doped Channel Fabricated by Novel Excimer Laser Annealing," Electron Devices, pp. 213-216 (2000).

Yamaguchi et al., "Modeling and characterization of polycrystalline-silicon thin-film transistors with a channel-length comparable to a grain size," Journal of Applied Physics, vol. 89, pp. 590-595, 2001.

Kimura et al., "Extraction of Trap States and the Oxide-Silicon Interface and Grain Boundary for Polycrystalline Silicon Thin-Film Transistors," The Japan Society of Applied Physics, vol. 40, Part 1, pp. 5227-5236, 2001.

Kimura et al., "Device Simulation of Carrier Transport through Grain Boundaries in Lightly Doped Polysilicon Films and Dependence on Dopant Density," The Japan Society of Applied Physics, vol. 40, Part 1, pp. 5237-5243, 2001.

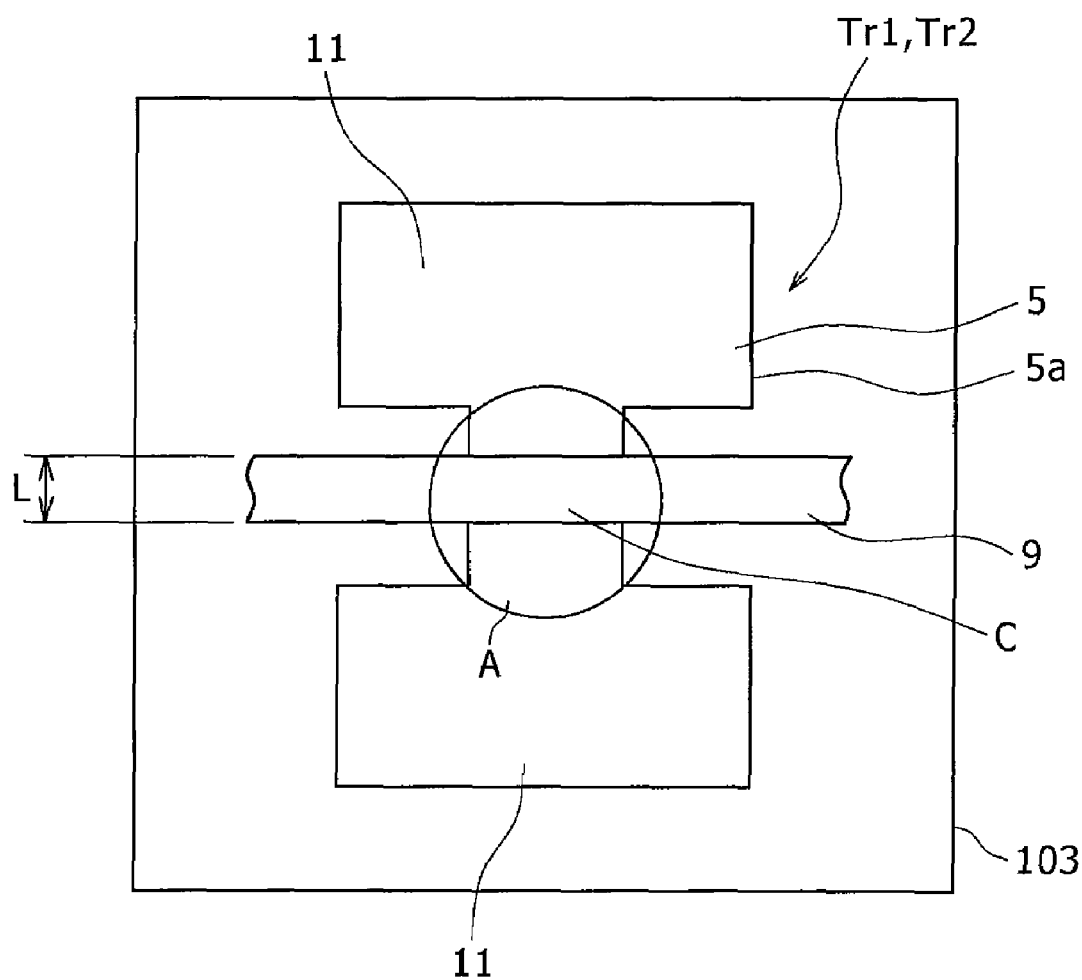

DISPLAY DEVICE INCLUDING THIN FILM TRANSISTORS

CROSS REFERENCES TO RELATED APPLICATIONS

The present application claims priority to Japanese Patent Application JP 2006-344131 filed with the Japan Patent Office on Dec. 21, 2006 and Japanese Patent Application JP 2006-144847 filed with the Japan Patent Office on May 25, 2006, the entire contents of which being incorporated herein by reference.

BACKGROUND

The present disclosure relates to a display, and particularly to a display in which thin film transistors are provided as switching elements for pixel electrodes and which performs active matrix display.

In a liquid crystal display and a flat panel type display using organic electroluminescence devices as light emitting devices, thin film transistors (TFTs) are used as switching elements for performing active matrix display with a plurality of pixels. The thin film transistors include TFTs using polycrystalline silicon (poly-Si) for active regions (poly-Si TFT) and TFTs using amorphous silicon (amorphous Si) for active regions (amorphous-Si TFT).

The poly-Si TFT is about 10 to 100 times higher than the amorphous Si TFT in carrier mobility and is smaller in deterioration of ON current. Thus, the poly-Si TFT has very excellent characteristics for use as a constituent material of switching elements.

As a technology of manufacturing the poly-Si TFT, the so-called low-temperature poly-Si process in which an amorphous Si film is made polycrystalline by using a low temperature process at a temperature of generally not more than 600° C. has been developed, whereby a reduction in the cost of substrates has been realized. For example, in a low-temperature poly-Si process using an excimer laser, pulsed irradiation of an amorphous Si film with a laser beam shaped into a line form is conducted while moving the irradiation spot little by little so that the successive irradiation spots overlap mostly with each other, whereby the same portion of the amorphous Si film is irradiated with the laser beam from 10 to 20 times. This makes it possible to obtain a polycrystal in with a grain diameter made uniform over the whole area of the active region.

As another example of the low-temperature poly-Si process, there has been proposed a method in which an amorphous Si film is irradiated with a continuous laser beam obtained from the higher harmonics of YAG laser while moving the irradiation spot at a constant speed so that the irradiation energy is constant, thereby forming a crystallized region, and patterning is conducted so that the region free of grain boundary becomes an active region of a thin film transistor (refer to Japanese Patent Laid-open No. 2003-77834 (particularly, paragraphs 0091 to 0092, AND 0169)).

In addition, as a method for restricting the width of lateral growth of a crystal by multi-stage irradiation using a mask, the sequential lateral solidification (SLS) has been proposed from the University of Columbia and the like (refer to A. T. Vouysas, A. Limonov and J. S. Im, "Journal of Applied Physics" (2003), Vol. 94, pp. 7445 to 7452) referred to as Non-Patent Document 1 hereafter.

In recent years, in the above-mentioned flat panel type displays, development of a display with a high frame rate has been under way for the purpose of further enhancing the motion picture characteristics and contrast characteristic. In addition, development of a novel display using auto-light-emitting devices such as organic EL devices has also been under way. Along with these developments, there has been a request for development of a thin film transistor free of degradation of characteristics even upon abrupt flow of a large current and showing small dispersion of switching element characteristics, for use as a pixel electrode switching element capable of coping with the requirements in these displays.

The above-mentioned poly-Si TFT obtained by the low-temperature poly-Si process according to the related art has the remarkable advantages of characteristics suitable for passage of comparatively large currents, a high carrier mobility, and little deterioration of characteristics. On the other hand, however, the poly-Si TFT has the problem of larger dispersions of characteristics, particularly initial threshold voltage and ON current, among the individual devices, as compared with the amorphous-Si TFT.

In order to prevent such dispersions, it has been tried, in relation to the crystallization by use of an excimer laser, to minimize the dispersions among the individual devices by using a film having similar crystals of about 300 nm, comparable to the wavelength of the laser. However, even the use of a film made polycrystalline in this manner has not been sufficiently effective for suppressing the dispersions of characteristics among the individual devices.

The reason for the above problem lies in that, in the case of crystallization by the crystallizing method using an excimer laser annealing apparatus according to the related art, it is difficult to accurately control the size of crystal grains in the poly-Si film, and uneven grain diameters would result. The unevenness of grain diameter leads to dispersion of the number of grain boundaries in the channel part of each thin film transistor (TFT), resulting in dispersions of characteristics of the TFT (refer, for example, to K. Yamaguchi et al., J. Appl. Phys., Vol. 89, No. 1, p. 590; M. Kimura et al., Jap. J. Appl. Phys. Vol. 40, Part I (2001), No. 1, and the like). Besides, this problem is serious particularly in a display using organic EL devices, since it leads to color irregularities or the like on a display part.

In addition, the dispersions of characteristics of the TFT as above-mentioned are difficult to sufficiently suppress, even by the low-temperature poly-Si process described in Japanese Patent Laid-open No. 2003-77834. This is considered to be due to the phenomenon in which the crystalline region constituting the inside of the channel is enlarged, and, therefore, the effects of the presence or absence of faults, dislocations or the like in the inside of the crystals are heavily reflected on the dispersions of characteristics. Besides, the dispersion of mobility in the poly-Si TFT obtained by application of the SLS process is 10% or more, even in the case of the optimum process, as seen from FIG. 8 of Non-Patent Document 2. This is considered to arise from the presence of numerous non-controlled grain boundaries in the crystalline region of the lateral growth portion.

Thus, there is a desire for a display having good display characteristics free of irregularities in color or luminance.

SUMMARY

An embodiment of the present disclosure provides such a display by using as a pixel electrode switching element a thin film transistor which is small in time variations of transistor characteristics, is high in carrier mobility and yet has transistor characteristics evenly and accurately controlled.

To be more specific, according to an embodiment, there is provided a display including a driving substrate provided, arrayed thereon, with a plurality of pixel electrodes and thin film transistors for driving the pixel electrodes. Each of the thin film transistors includes a semiconductor thin film having an active region made to be polycrystalline by irradiation with an energy beam, and a gate electrode provided so as to cross the active region. In addition, particularly in a channel part of the active region overlapping with the gate electrode, the crystal state is varied periodically along the channel length direction, and substantially the same crystal state crosses the channel part.

In the display configured as above, the carriers passing through the channel part of the thin film transistor for driving the pixel electrode move, without fail, by crossing the grain boundaries which are provided periodically. Therefore, by controlling the period of the grain boundaries, the transistor characteristics (carrier mobility) of the thin film transistor can be controlled accurately. For example, where the size of the period or the number of the periods (the number of the grain boundaries) disposed in the channel part is made constant, the dispersion of carrier mobility among a plurality of devices can be suppressed. Besides, it has been found out that, where the crystal state in each period in this configuration is controlled to be a predetermined state, it is possible to maintain a high carrier mobility, which is an advantage of the device using a semiconductor thin film made polycrystalline, and to suppress the deterioration of the device characteristics.

As above-mentioned, according to an embodiment, a thin film transistor which is small in time variations of transistor characteristics, is high in carrier mobility and yet has transistor characteristics evenly and accurately controlled is used as a pixel electrode switching element. Therefore, it is thereby possible to prevent irregularities in color or luminance from being generated on the display, and to enhance the display characteristics of the display.

Additional features and advantages are described herein, and will be apparent from, the following Detailed Description and the figures.

BRIEF DESCRIPTION OF THE FIGURES

FIG. 3 is a plan view showing the general configuration of a thin film transistor provided in the display according to the embodiment;

DETAILED DESCRIPTION

Figure 1:
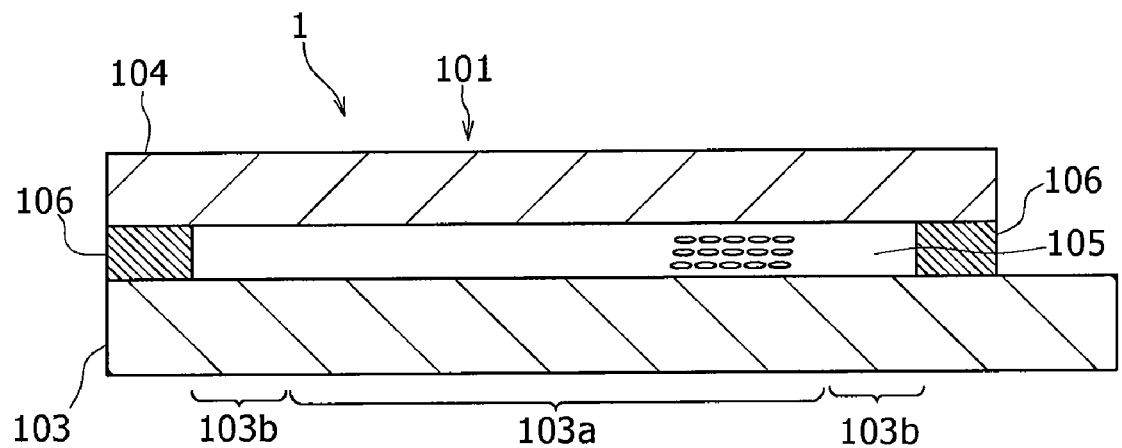
FIG. 1 is a schematic view of display according to an embodiment.

Embodiments are described in detail below, referring to the drawings. In the following embodiments, a configuration is applied to a liquid crystal display using a top gate type polycrystalline silicon TFT as a switching element for a pixel is described as an example.

<General Configuration of Display>

FIG. 1 shows a schematic sectional view of a display having a liquid crystal panel, according to an embodiment. As shown in the figure, the display 1 in this embodiment has a liquid crystal display 101. The liquid crystal display 101 has a liquid crystal layer 105 sandwiched between a first substrate 103 and a second substrate 104 disposed opposite to each other.

Of the assembly, the first substrate 103 is composed by use of a light-transmitting insulating substrate such as a synthesized quartz substrate, and is configured as a so-called driving substrate, in which a central part serves as a display region 103a, and pixel electrodes and thin film transistors as switching elements for driving the pixel electrodes are arranged on the surface, opposed to the liquid crystal layer 105, of the display region 103a. In addition, the second substrate 104 is composed by use of a light-transmitting insulating substrate such as a synthetic quartz substrate, with opposite electrodes disposed on its surface opposed to the liquid crystal layer 105. Further, the liquid crystal layer 105 is sealed between the first substrate 103 and the second substrate 104 by a sealant 106 provided between peripheral parts of the first substrate 103 and the second substrate 104.

Figure 2:
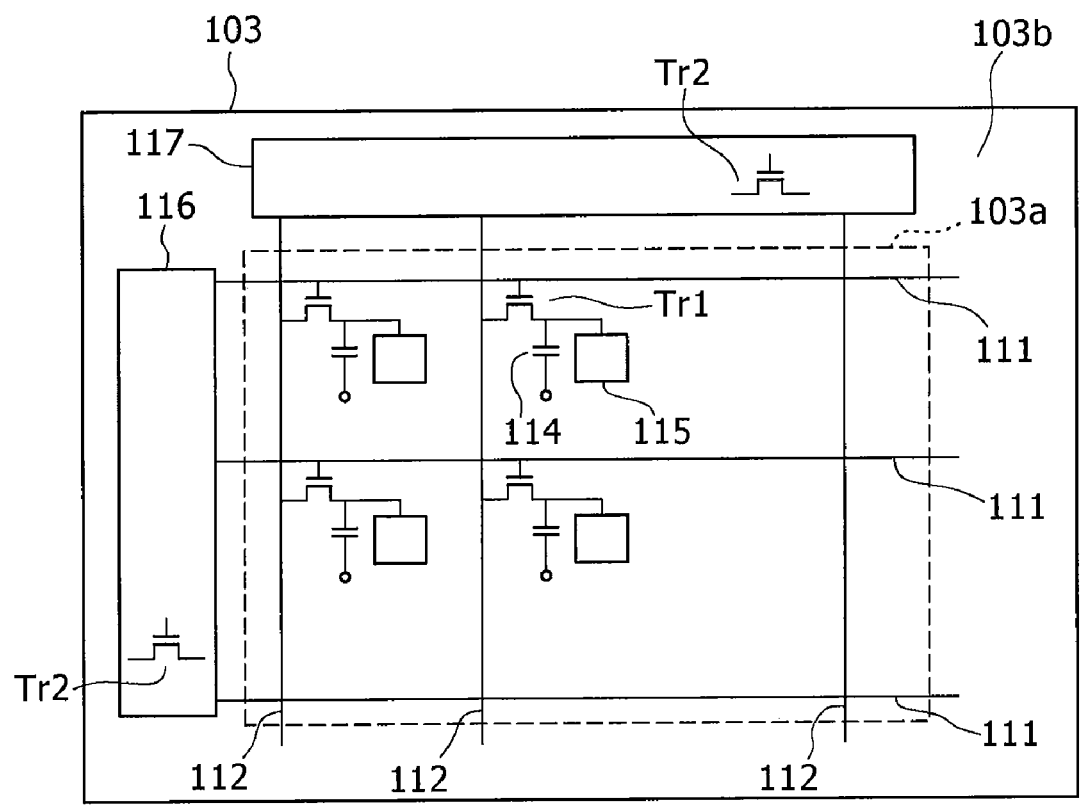
FIG. 2 is a circuit diagram of the display according to the embodiment.

FIG. 2 shows a circuit diagram on the first substrate 103 side in the display configured as above. A plurality of scan lines 111 and a plurality of signal lines 112 are arranged in a matrix form in the display region 103a disposed at a central part of the first substrate 103. A thin film transistor (TFT) Tr1, an auxiliary capacity element 114 connected thereto, and the pixel electrode 115 are provided at each of intersections of the scan lines 111 and the signal lines 112. Peripheral circuits such as a vertical transfer circuit 116 to which the scan lines 111 are connected, and a horizontal transfer circuit 117 to which the signal lines 112 are connected, are provided in a peripheral region 103b in the periphery of the display region 103a. Incidentally, these peripheral circuits also include thin film transistors Tr2, capacity elements, and wiring patterns connecting them.

In the display according to this embodiment, the crystal state of the active region 5a and the condition of layout of a gate electrode 9 relative to the crystal state, in each of the thin film transistors Tr1 provided in the display region 103a on the first substrate 103 side and the thin film transistors Tr2 provided in the peripheral region 103b, are characteristic.

FIG. 3 is a plan view showing the general configuration of each of the thin film transistors Tr1 and Tr2. As shown in FIG. 3, each of the thin film transistors Tr1 and Tr2 has the active region 5a including a semiconductor thin film 5, and the gate electrode 9 wired in the state of crossing a central part of the active region 5a.

Of this assembly, the active region 5a including the semiconductor thin film 5 is a region made to be polycrystalline by irradiating the semiconductor thin film 5 formed from amorphous silicon with an energy beam such as a laser beam. In addition, the semiconductor thin film 5 is patterned in the shape of an island including the active region 5a. In this case, as shown in the figure, the semiconductor thin film 5 may be so patterned that the amorphous semiconductor thin film 5 portion is not left in the periphery of the polycrystallized active region 5a. Or, alternatively, the amorphous semiconductor film 5 portion may be left in the periphery of the active region 5a.

In the active region 5a as above, the active region 5a part overlapping with the gate electrode 9 serves as a channel part C. In addition, in the active region 5a, the regions on both sides of the channel part C form a source/drain 11.

Figure 4A:
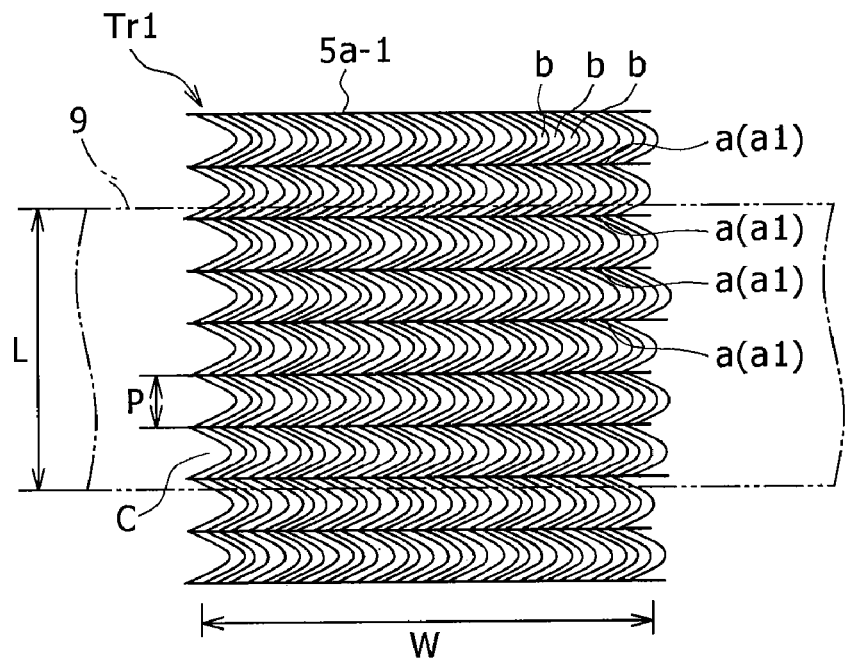
FIGS. 4A and 4B are plan views showing the configuration of an active region centered on a channel part of the thin film transistor provided in the display according to the embodiment.
Figure 4B:
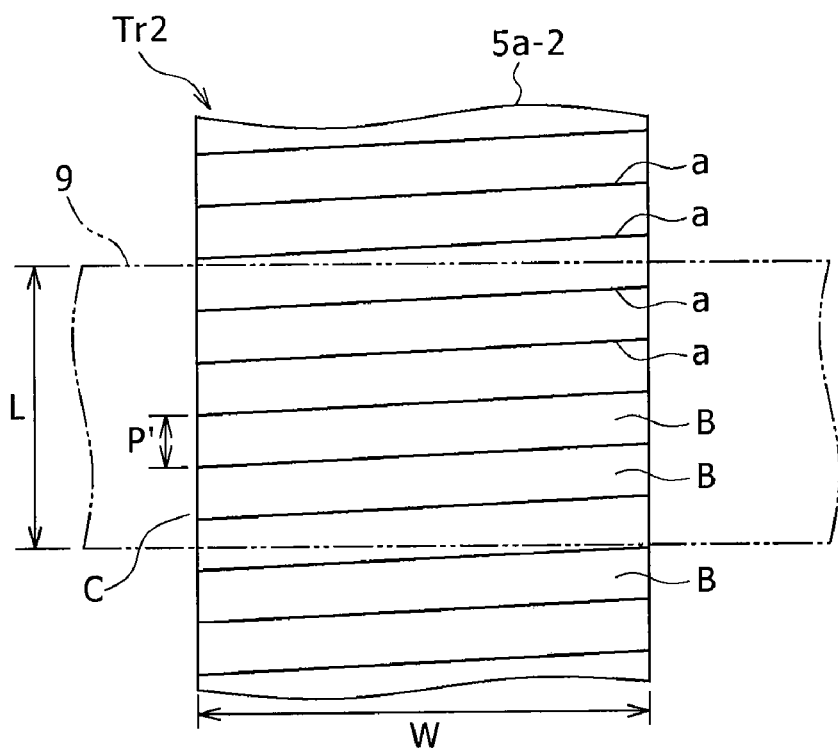

FIGS. 4A and 4B are plan views showing the configuration of active regions 5a-1, 5a-2 centered on the channel parts C of the thin film transistors Tr1, Tr2 characteristic of this embodiment. FIG. 4A is a plan view showing the active regions 5a-1 of the thin film transistors Tr1, and FIG. 4B is a plan view showing the active regions 5a-2 of the thin film transistors Tr2.

As shown in these figures, for example, crescent-shaped crystal grains b, b, . . . are arranged along the extending direction of the gate electrode 9, in the active region 5a-1 of the thin film transistor Tr1 provided in the display region 103a. On the other hand, a belt-shaped crystal grain B is extended in substantially the same direction as the gate electrode 9, in the active region 5a-2 of the thin film transistor Tr2 provided in the peripheral region 103b.

Now, the detailed configurations of the active regions 5a-1, 5a-2 of the thin film transistors Tr1, Tr2 will be described in the order of their respective configurations and methods of forming the active regions.

<Configuration of Thin Film Transistor Tr1 in Display Region>

As shown in the enlarged plan view of FIG. 4A, the active region 5a-1 of the thin film transistor Tr1 provided in the display region 103a includes an array of the crescent-shaped crystal grains b, b, . . . .

In the active region 5a-1, at least the crystal state in the channel part C is periodically varied along the channel length direction, and substantially the same crystal state crosses the channel part C. Particularly, in this case, at least the channel part C overlapping with the gate electrode 9 is provided with a plurality of series of grain boundaries a along the extending direction of the gate electrode 9, in the state of crossing the channel part C, and these crystal grains a are periodically provided while keeping a predetermined period P along the channel length L direction.

The crystal state between the grain boundaries a-a is substantially the same along the extending direction of the gate electrode 9. Incidentally, the configuration in which the grain boundaries a are periodically disposed as above-mentioned may cover not only the channel part C but also the whole region of each active region 5a-1.

As described in detail in the description of the manufacturing method below, the series of grain boundaries a are grain boundaries which are generated, for example, by scanning an energy beam in parallel while keeping the predetermined period P and are parallel to the scanning direction.

In addition, the line width of the gate electrode 5 (corresponding to the channel length L) is designed based on the specifications of the thin film transistor formed here, and a predetermined number of grain boundaries a are set on the lower side thereof so as to cross the channel part C in the channel width W direction. Particularly, the thin film transistors Tr1 provided in the display region may be required to be identical in characteristics, so that it is particularly important that substantially the same number of grain boundaries a are provided in each of the channel parts C. The term "substantially the same number" used here means a number which is preferably in the range of (a predetermined number) ±1.

In addition, as for the number of the grain boundaries a provided in the channel part C, dispersion of characteristics of the thin film transistors can be uniformized as the dispersion of the proportion of the actual number to the predetermined number is smaller. Therefore, it is more preferable that the number of the grain boundaries a provided in the channel part C is greater, in the range of two or more. Specifically, as described below in relation to embodiments, it is preferable that the period P is set according to the channel length in such a manner that about 25 grain boundaries a extended in the channel width direction are provided in the channel part C. It is to be noted here, however, that the carrier mobility in the channel length L direction is lower as the number of the grain boundaries a crossing the channel length L direction in the channel part C is greater, and, therefore, it is preferable that the number of the grain boundaries a is greater within such a range that the carrier mobility is kept high to a certain extent.

Besides, in order to stabilize the number of grain boundaries a disposed in the channel part C as above-mentioned, the plurality of grain boundaries a at least in the channel part C in the active region 5a-1 are disposed in parallel to each other and the period P thereof is constant.

Figure 5:
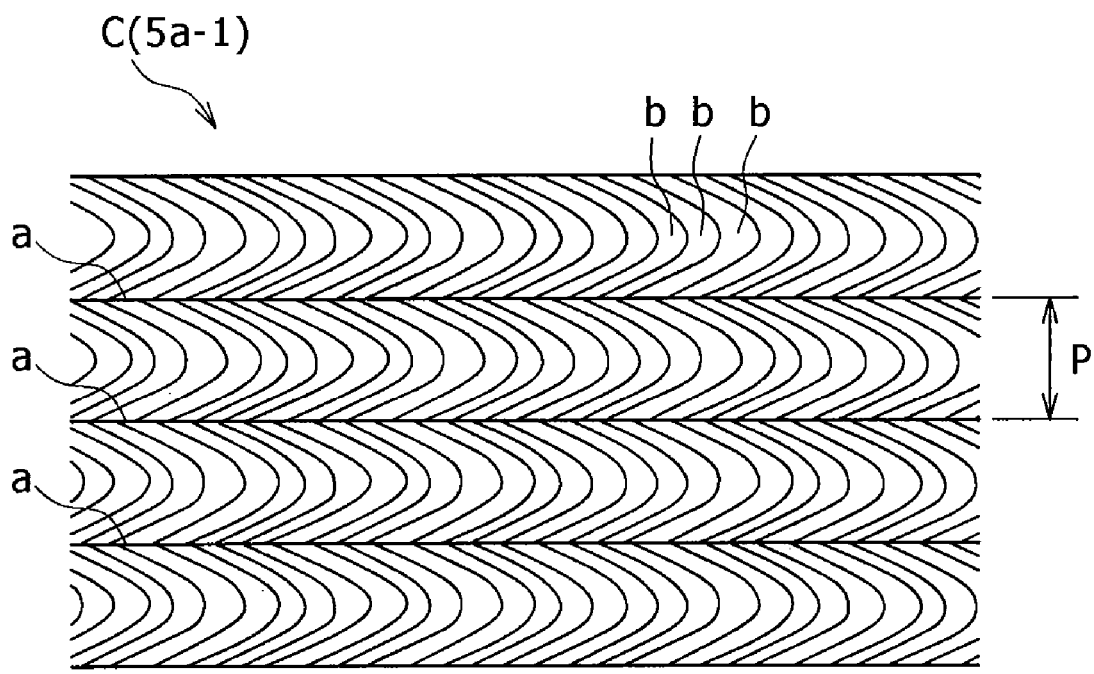
FIG. 5 is an enlarged plan view showing a first example of the channel part (active region) of the thin film transistor in a display region.

FIG. 5 is an enlarged plan view showing a first example of the channel part C (active region 5a-1) in the thin film transistor Tr1. As shown in the figure, in the channel part C (active region 5a-1) in which the grain boundaries a are disposed as above-mentioned, crystal grains b in a crescent shape convex in the extending direction of the grain boundaries a are preferably arrayed between the grain boundaries a. These crystal grains b are so sized as to fully range between the grain boundaries a-a and are arrayed along the extending direction of the grain boundaries a. In addition, it is preferable that the grain boundaries a are periodically disposed in the active region 5a-1 including the channel part C and that the active region 5a-1 is crystallized over the whole area thereof, without including any amorphous region.

Figure 6:
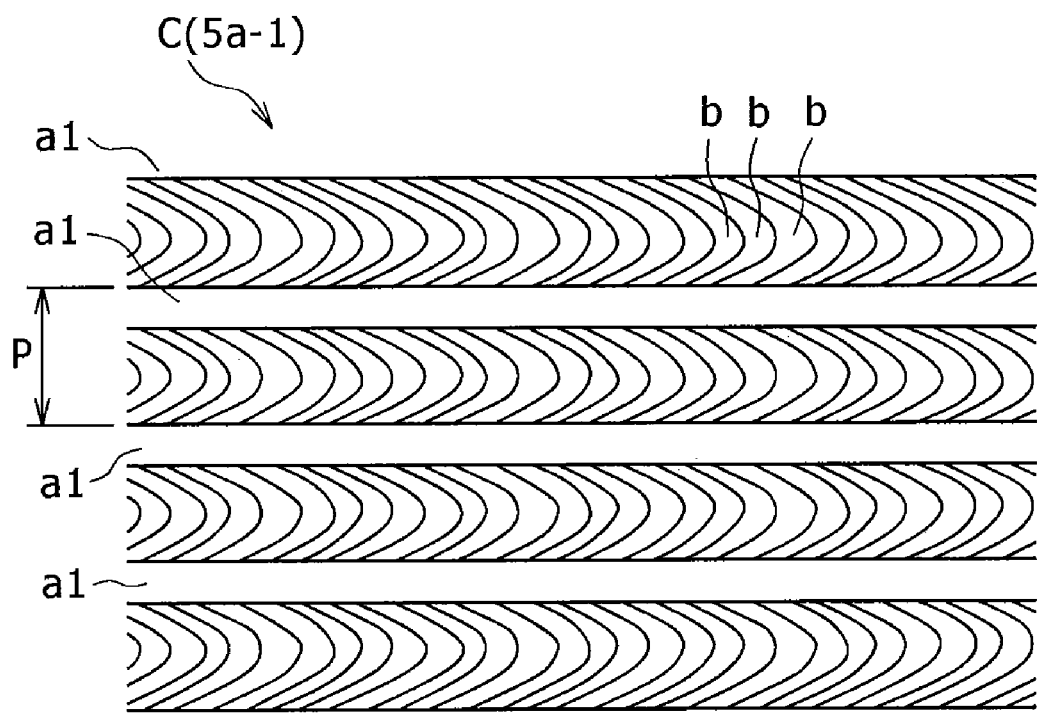
FIG. 6 is an enlarged plan view showing a second example of the channel part (active region) of the thin film transistor in the display region.

FIG. 6 is an enlarged plan view showing a second example of the channel part C (active region 5a-1) in the thin film transistor Tr1. As shown in the figure, in the case of a thin film transistor Tr1 provided in the display region for the purpose of pixel switching, grain boundaries a1 may be configured as an amorphous regions. In this case, it is preferable that crystalline belts in which crystal grains b in a crescent shape convex in the extending direction of the grain boundaries a1, which are configured as amorphous regions (amorphous belts) and which each have a predetermined width, are arrayed are provided respectively between the grain boundaries a1. The crystal grains b are so sized as to fully range between the grain boundaries a1-a1 and are arrayed along the extending direction of the grain boundaries a1.

Incidentally, the example of the configuration in which the grain boundaries a1 are provided as amorphous regions is not limited to the second example shown in FIG. 6.

Figure 7A:
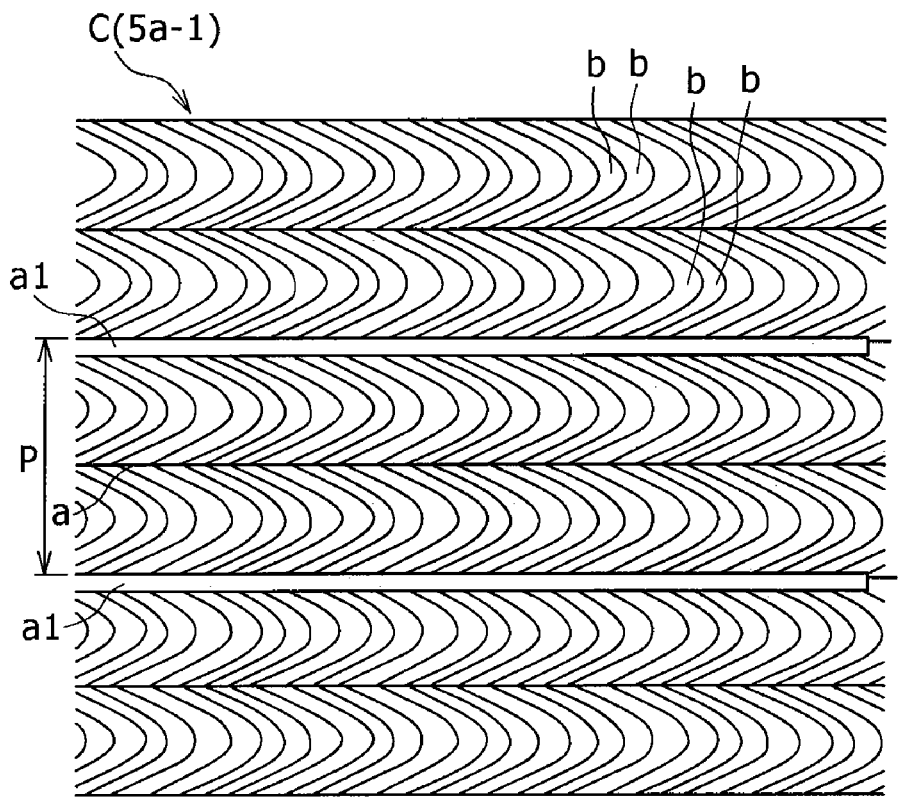
FIGS. 7A and 7B are enlarged plan views of a further example of the channel part (active region) of the thin film transistor in a display region.

For example, as shown in FIG. 7A, the crystal grains b in a crescent shape convex in the extending direction of the grain boundaries a1 formed as amorphous regions may be arranged in two (or more) rows between the grain boundaries a1. In this case, a continuous linear grain boundary a along the extending direction of the grain boundaries a1 is provided between the rows in which the crystal grains b are arrayed, and the crystal grains b so sized as to fully range between the grain boundaries a1-a and having the crescent shape convex in the extending direction of the grain boundaries a1, a are arrayed. Besides, a periodic structure is provided in which the crystal grains b are arrayed in two or more rows between the grain boundaries a1, which are configured as amorphous regions and are provided at a predetermined period P.

Furthermore, the shape of the crystal grains b arrayed between the grain boundaries a1 formed as amorphous regions is not limited to the crescent shape.

Figure 7B:
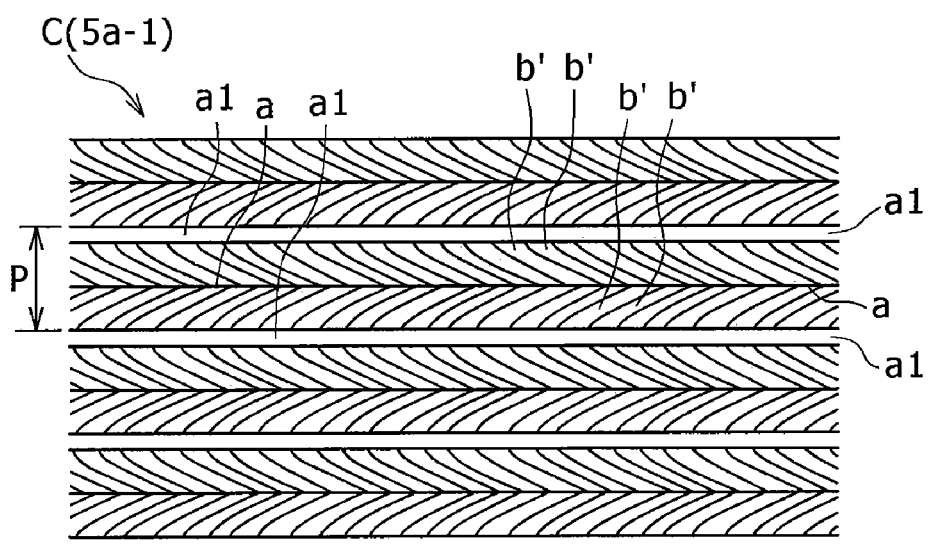

For instance, as shown in FIG. 7B, crystal grains b' having a semi-crescent shape obtained by bisecting a crescent shape in line symmetry may be arrayed. In this case, the grain boundary a1 formed as an amorphous region and the linear grain boundary a are alternately provided between the rows of the crystal grains b'.

The crescent-shaped crystal grains b and the semicrescent-shaped crystal grains b' as above-mentioned are crystal grains formed by scanning an energy beam along the extending direction of the grain boundaries a, a1, and the forming method thereof is described in detail below in the description of the manufacturing method.

<Fabricating Method-1 of Thin Film Transistor Tr1 in Display Region>

First of all, a method of fabricating a thin film transistor Tr1 having the configuration described above referring to FIGS. 4A and 5 is described below, based on FIGS. 8A to 8D and referring to other figures.

Figure 8A:
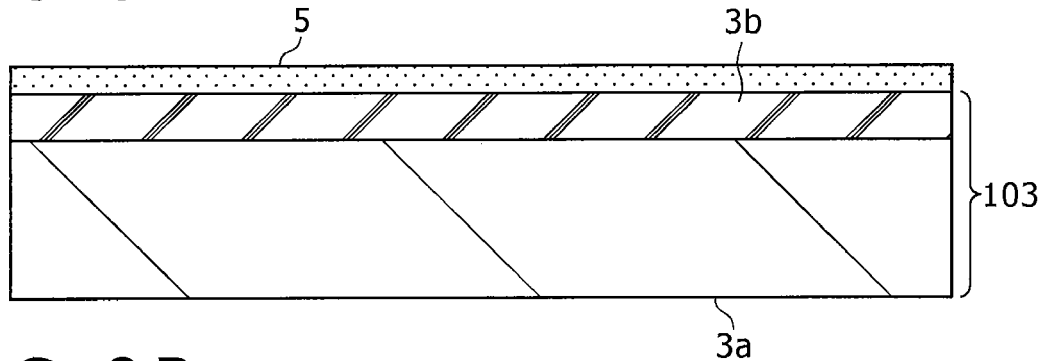
FIGS. 8A to 8D show sectional step diagrams illustrating a method of manufacturing a thin film transistor.

First, as shown in FIG. 8A, a substrate 3a for forming a thin film semiconductor device is prepared. Examples of the substrate 3a include glass, quartz or sapphire substrates as amorphous substrates, plastic substrates, and metallic substrates made of aluminum, stainless steel or the like.

An insulating buffer layer 3b for preventing transfer of heat to the substrate 3a is provided on one primary surface of the substrate 3a. Examples of the buffer layer 3b include layers of silicon oxide, silicon nitride, silicon carbide, etc. and oxide films of Ti, Al, Zr, Hf, etc. The buffer layer 3b can be formed by any of known vacuum film forming techniques such as CVD, sputtering, and vapor deposition. In addition, any of insulating films normally used as, for example, a layer insulating film such as inorganic SOG films and organic SOG films may also be used as the buffer layer 3b. Furthermore, any of dielectric films formed by anodic oxidation of metallic films and films formed by known techniques such as sol-gel process and MOD (Metal Organic Deposition) may be used as the buffer layer 3b.

Next, an amorphous semiconductor thin film 5 is formed on a principal surface of the first substrate 103 having a surface covered by the buffer layer 3b as above. Here, as an example, a semiconductor thin film 5 including amorphous silicon is formed by PE-CVD (plasma enhanced-chemical vapor deposition) process. The semiconductor thin film 5 thus obtained includes a so-called hydrogenated amorphous silicon (a-Si:H) which contains a large amount of hydrogen. In addition, the thickness of the semiconductor thin film 5 formed here is, for example, 20 to 100 nm.

Incidentally, the method of forming the semiconductor thin film 5 is not limited to the above-mentioned PE-CVD process, inasmuch as it is a method by which film forming temperature can be kept at a low temperature. Thus, a coating process may be adopted. In this case, a mixture containing a polysilane compound mixed in a solvent is applied to the substrate 103, followed by drying and annealing, to form the semiconductor thin film 5. In any the film forming methods in which the film forming temperature is kept at a low temperature, such as the PE-CVD process and the coating process just-mentioned, it is possible to obtain a semiconductor thin film 5 including hydrogenated amorphous silicon (a-Si:H) containing hydrogen in an amount of about 0.5 to 15 atoms %.

Subsequently, if necessary, a so-called dehydrogenation annealing treatment for removing excess hydrogen ions from the inside of the semiconductor thin film 5 is carried out. The hydrogenation annealing treatment is conducted by, for example, furnace annealing at a temperature of from 400° C. to 600° C. However, the dehydrogenation annealing treatment may be omitted in the case where the following crystallization annealing treatment is conducted by controlling the irradiation energy so as to remove excess hydrogen from the laser beam irradiated parts without inducing gasification of hydrogen ions contained in the semiconductor thin film 5 or expansion of the hydrogen gas.

Figure 8B:
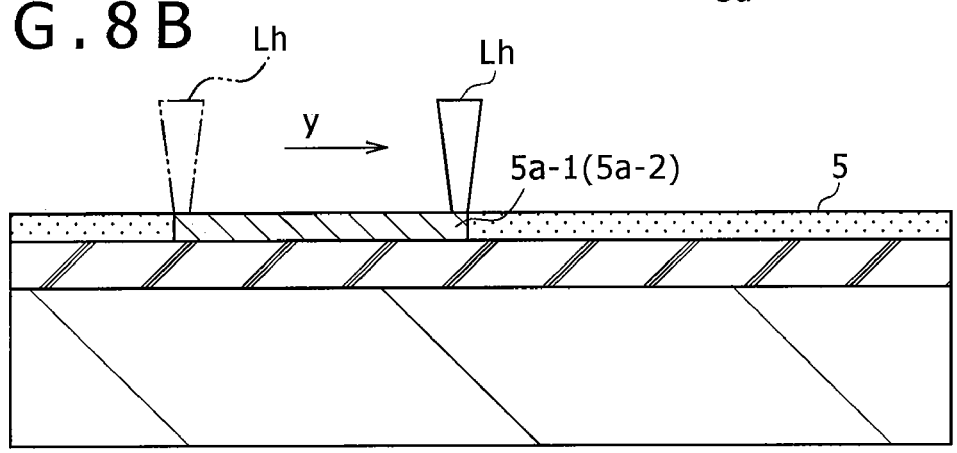

After the above steps, as shown in FIG. 8B, a crystallizing step is carried out in which an active region 5a-1 set in the semiconductor thin film 5 is crystallized by irradiation with a laser beam Lh used as an energy beam.

In the crystallizing step, the semiconductor thin film 5 is irradiated by the laser beam Lh while scanning the laser beam Lh at a predetermined speed in a predetermined direction.

In this case, the position of irradiation with the laser beam Lh is moved at a predetermined pitch in the width direction of a gate electrode 9 to be formed (i.e., in the channel length L direction), and the laser beam Lh is scanned in a predetermined scanning direction y at each irradiation position upon the movement. Here, the scanning direction y of the laser beam Lh is set to substantially coincide with the extending direction of the gate electrode 9, i.e., to coincide with the channel width W direction. Therefore, in each active region 5a-1, the position of irradiation with the laser beam Lh is moved in a direction set depending on the wiring direction of the gate electrode 9, and the laser beam Lh is scanned in the predetermined scanning direction y at each irradiation position upon the movement.

Besides, in the crystallizing step, the irradiation amount, irradiation spot diameter, scanning speed of the laser beam Lh as well as the moving pitch of the irradiation position and the like are so set that linear grain boundaries a appear at a predetermined period P in parallel to the scanning direction y of the laser beam Lh.

Figure 9A:
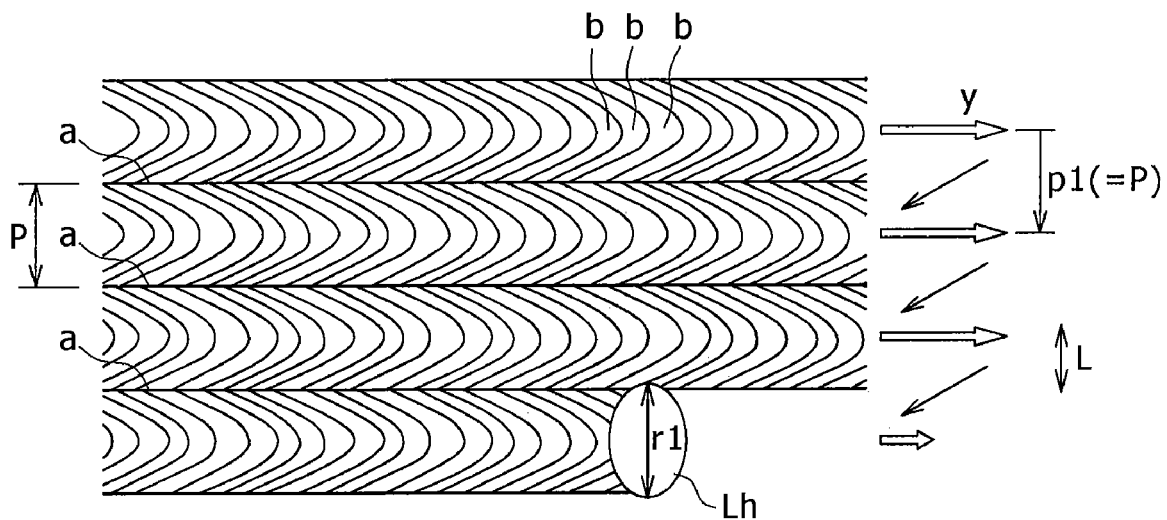
FIGS. 9A and 9B are enlarged plan views showing an example of a method of crystallizing the channel part (active region) of the thin film transistor in a display region.

As the crystallizing step, for example, a method in which explosive crystallization as shown in FIG. 9A is applied can be mentioned. For irradiation with the laser beam Lh in such a manner as to induce explosive crystallization, the conditions of irradiation with the laser beam Lh controlled in the size of the irradiated region, the irradiation speed and irradiation energy are so set that heat is conducted to the semiconductor thin film 5 in the region surrounding the irradiated region before the semiconductor thin film 5 in the irradiated region is completely melted at the time of scanning the laser beam Lh.

In this case, the wavelength of the laser beam Lh with which to irradiate the semiconductor thin film 5 is selected to a value for ensuring a comparatively low absorption coefficient such that the laser beam Lh is wastelessly absorbed into the semiconductor thin film 5 without being transmitted through the semiconductor thin film 5, based on the thickness and the absorption coefficient of the semiconductor thin film 5. Specifically, in an example wherein the semiconductor thin film 5 formed of amorphous silicon has a thickness of 50 nm, a laser beam with a wavelength of 350 to 470 nm is preferably used. Examples of the oscillation source of the laser beam Lh with such a wavelength include a GaN-based or other compound semiconductor laser oscillator and a YAG laser oscillator. Other irradiation conditions than the wavelength of the laser beam Lh, such as the numerical aperture NA of an objective lens used for irradiation with the laser beam Lh and the scanning speed and irradiation energy of the laser beam Lh, may be controlled, whereby the explosive crystallization of the semiconductor thin film 5 can be effected.

Then, at each irradiation position upon movement of the laser beam Lh at a predetermined moving pitch p1 in the channel length L direction, the laser beam Lh is scanned in the scanning direction y substantially perpendicular to the channel length L direction, under the above-mentioned irradiation conditions. In this case, the spot diameter r1 of the laser beam Lh relative to the moving pitch p1 is controlled so that no amorphous region is left between the adjacent irradiation positions of the laser beam Lh and that a continuous grain boundary a is generated in parallel to the scanning direction y.

As a result of the above, polycrystallization of the semiconductor thin film 5 progresses in such a manner that the grain boundaries a are provided at a period P equal to the width of the moving pitch p1. Then, crystal grains b in a crescent shape convex in the scanning direction y of the laser beam Lh are arrayed between the grain boundaries a-a, along the extending direction of the grain boundaries a.

Here, the spot diameter r1 of the laser beam Lh and the moving pitch p1 of the position of irradiation with the laser beam Lh (the period P of the grain boundaries a) are important factors for specifying the number of grain boundaries a (the number of periods) provided in the channel part. As has been described in the description of the configuration of the display, the number of the grain boundaries a (the number of periods) provided in the channel part is set to be large, within such a range as to secure the carrier mobility and to such an extent as to reduce the dispersion (to uniformize) the transistor characteristics. Here, further, the moving pitch p1 (the period P of the grain boundaries a) is so set that the number of the grain boundaries a in the channel part is as large as possible within such a range as not to spoil the tact time of the process. In addition, the spot diameter r1 of the laser beam Lh set according to the moving pitch p1 in such a manner that no amorphous region is left and that a continuous grain boundary a is generated.

Accordingly, when it is assumed that in general the channel length of the thin film transistor (the line width of the gate electrode) is not more than 10 μm, it is preferable to form about 25 grain boundaries a in the channel part C, taking also productivity into account. In this case, the moving pitch p1 of the irradiation position of the laser beam Lh (the period P of the grain boundaries a) is set at about 400 nm. The spot diameter r1 is set substantially comparable to the moving pitch p1 (the period P of the grain boundaries a), and is set to be on the order of several hundreds of nanometers in the range of 1 nm to 10 μm so that the continuous grain boundary a parallel to the scanning direction y is generated between the adjacent positions of irradiation with the laser beam Lh.

Figure 9B:
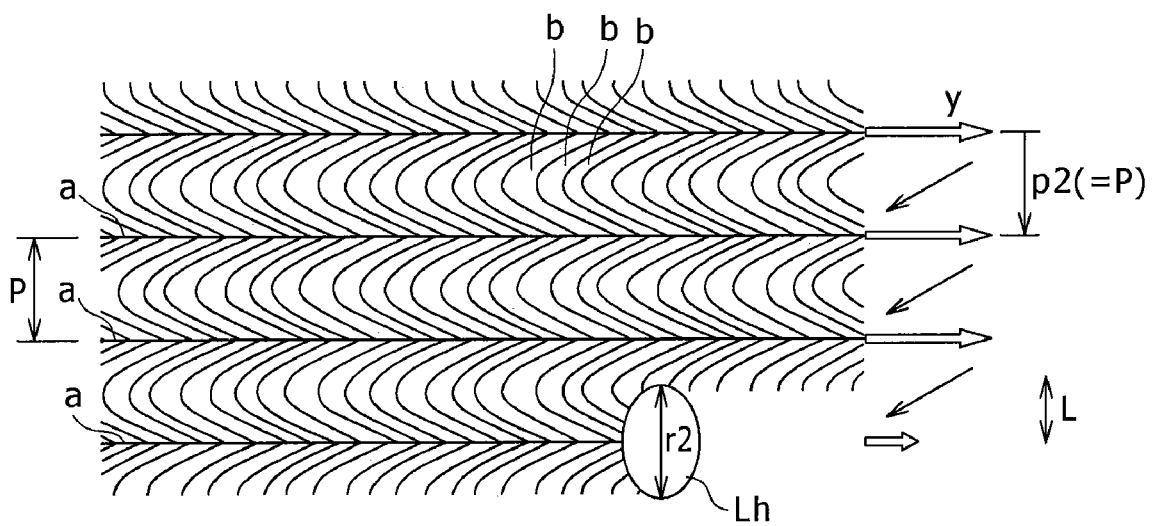

Other than the above-mentioned explosive crystallization, the crystallizing step may be carried out in such a manner as to generate a continuous grain boundary a parallel to the scanning direction y, in the vicinity of the center of the irradiation spot of the laser beam Lh, as shown in FIG. 9B. In order to irradiate with the laser beam Lh so as to generate the grain boundary a at such a position, the laser beam Lh is scanned so that the semiconductor thin film 5 is fully melted in the whole range in the depth direction at each position of irradiation with the laser beam Lh.

In this case, the irradiation conditions such as the wavelength of the laser beam Lh, the numerical aperture NA of an objective lens for irradiation with the laser beam Lh, and the scanning speed and irradiation energy of the laser beam Lh are controlled based on the thickness and absorption coefficient of the semiconductor thin film 5, whereby the semiconductor thin film 5 is fully melted in the depth direction. In the case of performing such a crystallization, also, a laser beam Lh with a wavelength of 350 to 470 mn obtained by use of a GaN-based or other compound semiconductor laser oscillator or a YAG laser oscillator can be used, like in the case of the explosive crystallization described above referring to FIG. 9A, and the semiconductor thin film 5 is fully melted in the depth direction by controlling the above-mentioned irradiation conditions.

In this case, at each irradiation position upon movement of the laser beam Lh at a predetermined pitch p2 in the channel length L direction, the laser beam Lh is scanned in a scanning direction y substantially perpendicular to the channel length L direction (in the extending direction of the gate wiring mentioned above). In this instance, the spot diameter r2 (in the channel length L direction) of the laser beam Lh relative to the moving pitch p2 of the laser beam Lh is so controlled that no amorphous region is left, between the adjacent position of irradiation with the laser beam Lh, and a continuous grain boundary a parallel to the scanning direction y is generated.

As a result of the above, the polycrystallization of the semiconductor thin film 5 progresses so that the grain boundaries a are provided at a period P equal in width to the moving pitch p2. Then, crystal grains b in a crescent shape convex in a direction opposite to the scanning direction y of the laser beam Lh are arrayed, along the extending direction of the grain boundaries a, between the grain boundaries a-a. According to such a crystallizing step, the crystal grains b are obtained by fully melting the semiconductor thin film 5 through irradiation with the laser beam Lh and recrystallizing the semiconductor thin film 5 through liquid-phase growth; therefore, the crystal quality is good, and carrier mobility is enhanced.

In this case, the spot diameter r2 of the laser beam Lh and the moving pitch p2 of the irradiation position of the laser beam Lh (the period P of the grain boundaries a) are so set that the number of the grain boundaries a in the channel part is as large as possible within such a range as not to spoil the tact time of the process, in the same manner as in the case of the explosive crystallization described above referring to FIG. 9A.

Here, in each of the crystallizing steps described above referring to FIGS. 9A and 9B, it is extremely important to uniformize the characteristics of the grain boundaries a formed by irradiation with the laser beam Lh. As the factors in making uniform the characteristics of the grain boundaries a, it is required that the laser irradiation energy density at each position of irradiation is constant, that the scanning speed is constant, that the moving pitch p1, p2 at the irradiation position is constant (the period P is constant), and that the thickness of the semiconductor thin film 5 is uniform.

Furthermore, in order to make constant the irradiation energy density of the laser beam Lh, it is desirable that continuous oscillation of the laser beam Lh is realized at least during irradiation of the active region 5a-1 with the laser beam Lh. The term "continuous oscillation" used here includes the case where a rest (e.g., a rest of up to 50 ns) exists within such a range that the temperature of the semiconductor thin film 5 is not lowered. Besides, in order to irradiate with the laser beam Lh at a constant irradiation energy density, it is desirable to use a laser beam irradiation system having a feedback function and a focus servo function. The feedback function and the focus servo function for energy can be constructed by a known technology used in a cutting machine for optical disks or the like.

In addition, the irradiation of the semiconductor thin film 5 is set in such a range that the scanning speed of laser irradiation is constant.

The movement of the irradiation position of the laser beam relative to the semiconductor thin film may be a relative movement. Namely, the substrate provided with the semiconductor thin film may be moved relative to the irradiation position of the laser beam which is fixed, or, alternatively, the irradiation position of the laser beam may be moved relative to the substrate which is fixed. Further, both the substrate 1 and the irradiation position of the laser beam may be moved.

Furthermore, the parallel scanning of the laser beam Lh in each of the crystallizing steps described referring to FIGS. 9A and 9B above may be sequentially conducted by use of a single laser oscillator, or may be conducted by use of a plurality of laser oscillators. Besides, in consideration of the manufacture of the thin film transistors for driving the display, the crystallizing step is preferably conducted simultaneously for a plurality of active regions 5a-1. Specifically, a method in which the crystallizing steps for a plurality of active regions 5a-1 arrayed on the face side of a substrate 3 can be simultaneously conducted by simultaneously irradiating the plurality of active regions 5a-1 with laser beams Lh, is preferable in consideration of productivity.

In order to realize such multi-spot irradiation with the laser beams Lh, a semiconductor laser oscillator is used as a laser beam oscillation source. A semiconductor laser oscillator is very small in size, as compared with other laser oscillator such as an excimer laser and a YAG laser; therefore, a plurality of semiconductor lasers can be arranged in a single apparatus and, in addition, a rated output of 200 mW can be realized in the case of continuous irradiation.

By use of the semiconductor laser oscillators, the apparatus design can be flexibly matched to the substrate size through an increase in the number of semiconductor lasers according to an increase in the area of the substrate. Therefore, it is possible to obtain a structure in which a multiplicity of transistors with the same performance are arranged on a large-sized substrate, which is advantageous over a method of controlling the grain boundaries by use of a mask as reported on a research level, in forming transistors with uniform characteristics over a large area.

After completion of the crystallizing step described above, as shown in FIG. 8C, pattern etching of the semiconductor thin film 5 into a predetermined shape is conducted so as to leave the crystallized active regions 5a-1, and the active regions 5a-1 are split into an island-like shape, to isolate the devices. In this case, as shown in the figure, the pattern etching of the semiconductor thin film 5 may be so conducted that an uncrystallized portion of the semiconductor thin film 5 is not left in the surroundings of the active region 5a-1. Or, alternatively, the pattern etching of the semiconductor thin film 5 may be so conducted that an uncrystallized portion of the semiconductor thin film 5 is left in the surroundings of the active region 5a-1. Incidentally, such a pattern etching of the semiconductor thin film 5 may be conducted prior to the above-described crystallizing step. In this case, the portions of the semiconductor thin film 5 patterned into island-like shapes including the regions to become the active regions 5a-1 are subjected to the above-mentioned crystallizing step.

Next, a gate insulating film 7 is formed over the substrate 1 in the state of covering the patterned active regions 5a-1. The gate insulating film 7 may be formed of silicon oxide or silicon nitride, and can be formed by a known method such as the ordinary PE-CVD process; other than this, the gate insulating film 7 may be formed by a known SOG or the like as a coating type insulating film. Incidentally, the formation of the gate insulating film 7 may be conducted prior to the pattern etching of the semiconductor thin film 5.

Subsequently, gate electrodes 9 in the form of crossing central parts of the active regions 5a-1 divided into the island-like shapes as above are formed on the gate insulating film 7. Here, the gate electrodes 9 are formed along the extending direction of the grain boundaries a formed in each active region 5a-1, as described referring to FIG. 4A above. In this case, in the case of devices having the same characteristics, the gate electrodes 9 with the same line width are patterned so that the same number of grain boundaries a are disposed beneath each of the gate electrodes 9.

In forming the gate electrodes 9 as above, first, an electrode material layer of aluminum, for example, is formed by sputtering or vapor deposition. Next, a resist pattern is formed on the electrode material layer by lithography. Thereafter, using the resist pattern as a mask, the electrode material layer is etched, to pattern the gate electrodes 9.

Incidentally, the formation of the gate electrodes 9 is not limited to the above-mentioned procedure; for example, a printing technique in which metal particulates are applied may be adopted. Besides, in the etching of the electrode material layer in forming the gate electrodes 9, the gate insulating film 7 may be etched successfully.

Figure 8C:
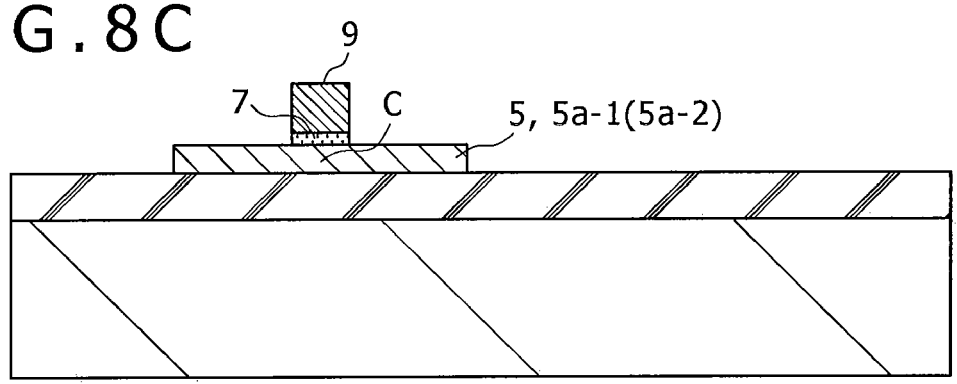
Figure 8D:
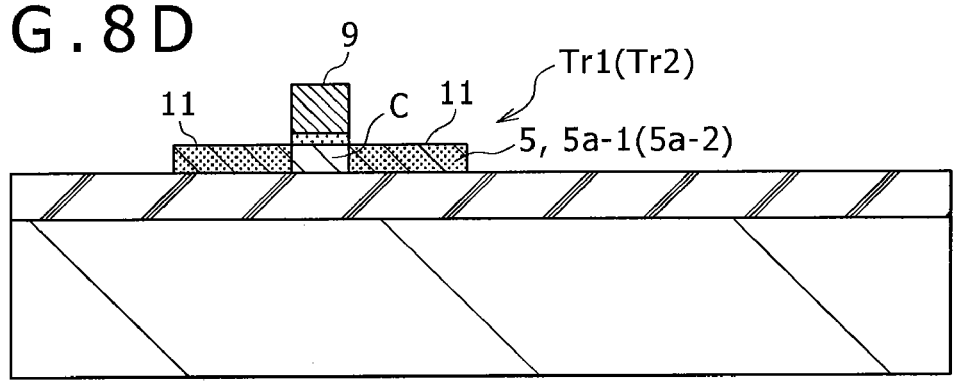

Thereafter, as shown in FIG. 8D, a source/drain 11 with an impurity introduced thereinto is formed on a self-aligned basis in the active region 5a-1, by use of the gate electrode 9 as a mask. Here, for example, ion implantation using the gate electrodes 9 as a mask is conducted.

As a result of the above, a channel part C composed of a portion, with the impurity not introduced thereinto, of the crystallized active region 5a-1 is formed on the lower side of the gate electrode 9. The source/drain 11 and the channel part C under the gate electrode 9 are composed of polycrystalline silicon obtained by crystallization of the semiconductor thin film 5, so that a thin film transistor Tr1 of the configuration described referring to FIGS. 4A and 5 above is obtained.

<Fabricating Method-2 of Thin Film Transistor Tr1 in Display Region>

In the case of fabricating a thin film transistor Tr1 having an active region 5a-1 configured as described referring to FIG. 6 above, for example, the method based on application of the explosive crystallization described referring to FIG. 9A above may be used.

Figure 10:
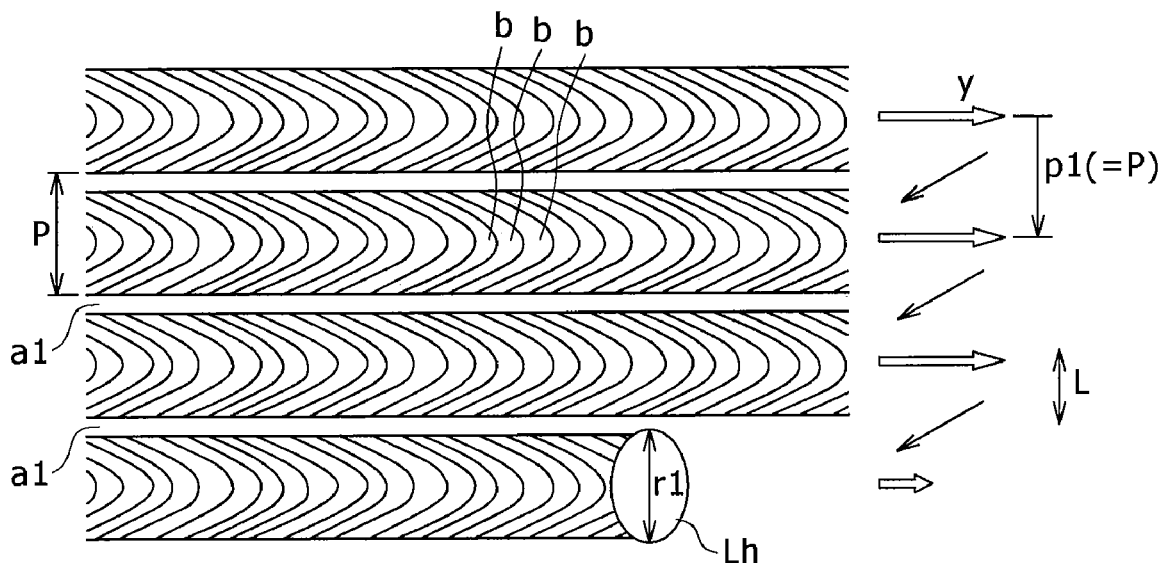
FIG. 10 is an enlarged plan view showing another example of the method of crystallizing the channel part (active region) of the thin film transistor in the display region.

It is to be noted here, however, that as shown in FIG. 10, in moving the laser beam Lh at a predetermined moving pitch p1 in the channel length L direction, the moving pitch p1 is controlled relative to the spot diameter r1 of the laser beam Lh in such a range that the laser beams Lh do not overlap with each other, so as to ensure that a grain boundary a1 with a predetermined width configured as an amorphous region is left between the adjacent irradiation positions of the laser beam Lh.

As a result of this, polycrystallization of the semiconductor thin film 5 proceeds so that the grain boundaries a1 with the predetermined width configured as amorphous regions are provided at a period P equal to the moving pitch p1. This ensures that crystal grains b in a crescent shape convex in the scanning direction y of the laser beam Lh are arrayed along the extending direction of the amorphous grain boundaries a1, between the grain boundaries a1-a1.

In addition, as has been described above referring to FIG. 7A, in the case where the crescent-shaped crystal grains b are arrayed in a plurality of rows (e.g., in two rows) between the amorphous grain boundaries a1-a1, the first run of scanning of the laser beam Lh in the scanning direction y is conducted, then the irradiation position of the laser beam Lh is moved in the channel length L direction at a first predetermined pitch such that the former and latter laser beams Lh overlap with each other, and the second run of scanning of the laser beam Lh in the scanning direction y is conducted at the irradiation position upon the movement. By this, the crystal grains b in the second row are formed while forming a continuous grain boundary a in the scanning direction y between themselves and the crystal grains b formed by the first run of scanning, without leaving any amorphous region. In addition, the crescent-shaped crystal grains b are arrayed on both sides of the grain boundary a. Then, the irradiation position of the laser beam Lh is moved in the channel length L direction at a second predetermined pitch such that the former and latter laser beams Lh do not overlap with each other and that a grain boundary a1 with a predetermined width configured as an amorphous region is left, and the first run of scanning of the laser beam Lh in the scanning direction y is conducted at the irradiation position upon the movement. Thereafter, while the first predetermined pitch and the second predetermined pitch are fixed, the second run of scanning of the laser beam Lh and the first run of scanning of the laser beam Lh are repeated. Incidentally, in the case where the crescent-shaped crystal grains b are arrayed in three or more rows between the grain boundaries a1-a1 each having a predetermined width, after the irradiation position is moved at the first predetermined pitch and the second run of scanning of the laser beam Lh is conducted, the irradiation position is further moved at the first predetermined pitch and the third run (or more runs) of scanning of the laser beam Lh is conducted, then the first run of scanning of the laser beam Lh is conducted, and the second and latter runs of scanning are repeated.

<Fabricating Method-3 of Thin Film Transistor Tr1 in Display Region>

First, in the case of fabricating a thin film transistor Tr1 having an active region 5a-1 configured as described referring to FIG. 7B above, for example, the method based on application of crystallization for fully melting the semiconductor thin film 5 over the whole range in the depth direction as described referring to FIG. 9B above may be used.

Figure 11:
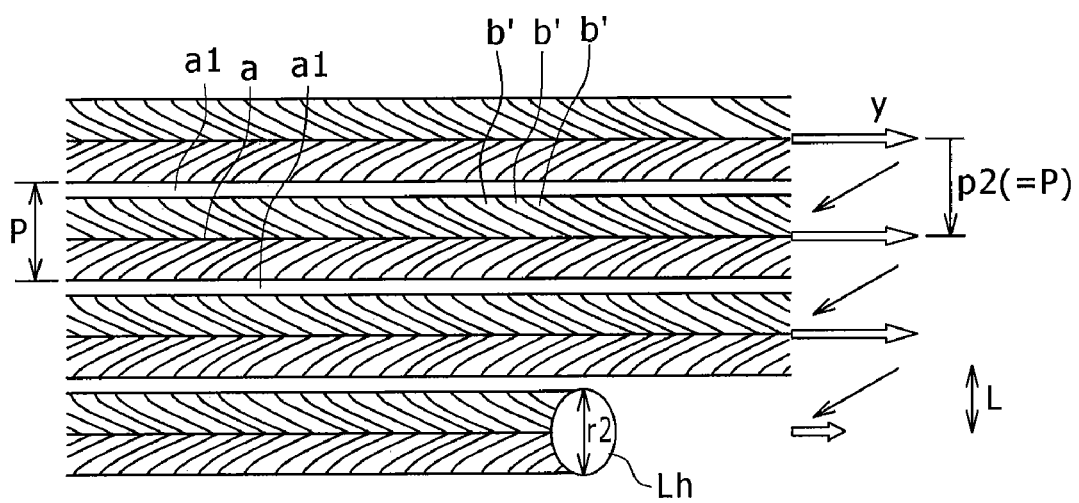
FIG. 11 is an enlarged plan view showing a further example of the method of crystallizing the channel part (active region) of the thin film transistor in the display region.

Here, as shown in FIG. 11, at each irradiation position upon movement of the laser beam Lh at a predetermined moving pitch p2 in the channel length L direction, the laser beam Lh is scanned in a scanning direction y substantially perpendicular to the channel length L direction (i.e., in the extending direction of the gate wiring mentioned above). In this case, the moving pitch p2 of the laser beam Lh relative to the spot diameter r2 (in the channel length L direction) of the laser beam Lh is so controlled that a grain boundary a1 with a predetermined width configured as an amorphous region is left between the adjacent irradiation positions of the laser beam Lh.

Then, the irradiation conditions are so controlled as to fully melt the semiconductor thin film 5 in the depth direction, whereby crystallization is made to proceed in such a manner that a continuous grain boundary a is formed along the scanning direction y at the center of scanning of the laser beam Lh, and semicrescent-shaped crystal grains b' are formed along the extending direction of the grain boundary a, on both sides of the grain boundary a. In addition, grain boundaries a1 with a predetermined width configured as amorphous regions are left on both sides of the area where the semicrescent-shaped crystal grains b' are arrayed. According to such a crystallizing step, the crystal grains b' are obtained by fully melting the semiconductor thin film 5 through irradiation with the laser beam Lh and recrystallizing the semiconductor thin film 5 through liquid-phase growth, so that crystal quality is good, and carrier mobility is enhanced.

<Configuration of Thin Film Transistor Tr2 in Peripheral Region>

As shown in the enlarged plan view in FIG. 4B, the active region 5a-2 of a thin film transistor Tr2 provided in a peripheral region 103b includes an array of belt-shaped crystal grains B, B, . . . .

In this active region 5a-2, the crystal state in at least a channel part C is periodically varied along the channel length direction, and substantially the same crystal state crosses the channel part C. Particularly, here, a plurality of continuous grain boundaries a are provided along the extending direction of the gate electrode 9, at least in the channel part C overlapping with the gate electrode 9, in the condition of crossing the channel part C. These grain boundaries a are periodically provided while keeping a predetermined period P' in the channel length L direction.

Besides, between the grain boundaries a-a, belt-shaped crystal grains B with the same width as the pitch P' are provided along the extending direction of the grain boundaries a. Incidentally, the configuration in which the belt-shaped crystal grains B are periodically arranged may not necessarily be limited to the channel part C, and may cover the whole area of the active region 5a-2.

Incidentally, the line width of the gate electrode 9 (corresponding to the channel length L) is designed based on the specifications of the thin film transistor to be formed here, and a predetermined number of the grain boundaries a are arranged on the lower side of the gate electrode so as to cross the channel part C in the channel width W direction, in the same manner as in the thin film transistor Tr1 provided in the display region.

<Fabricating Method of Thin Film Transistor Tr2 in Peripheral Region>

Fabrication of the thin film transistor Tr2 in the peripheral region 103b as above-mentioned may be achieved in the same manner as the fabricating method of the thin film transistor Tr1 in the display region descried referring to FIGS. 8A to 8D above, except that the crystallization of the semiconductor thin film 5 is replaced by the following procedure.

Figure 12A:
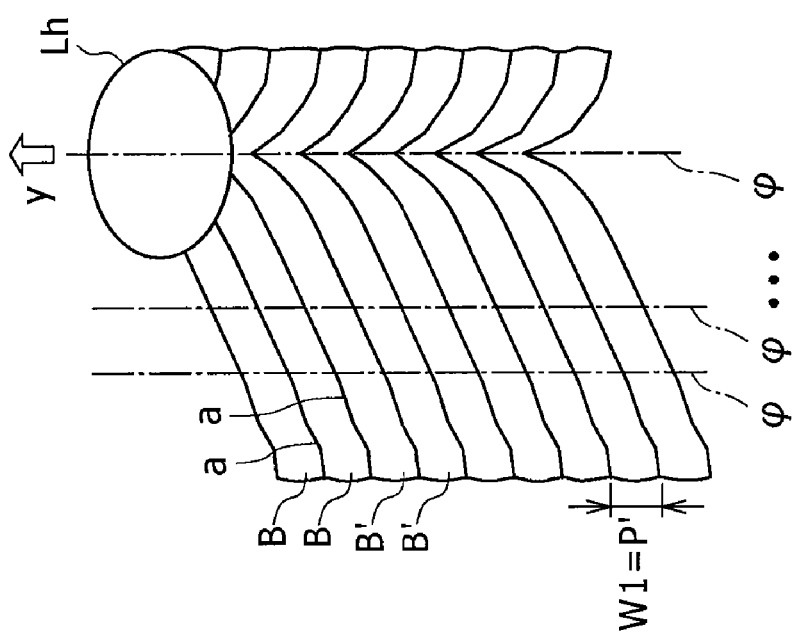
FIGS. 12A to 12C are an enlarged plan views showing yet another example of the method of crystallizing the channel part (active region) of the thin film transistor in the display region.

First, as shown in FIG. 12A, irradiation with a laser beam Lh is conducted while scanning the laser beam Lh at a predetermined speed in a fixed scanning direction y. Particularly, the irradiation conditions of the laser beam Lh are set according to the thickness of the semiconductor thin film so that the semiconductor thin film 5 is fully melted in the depth direction thereof by irradiation with the laser beam Lh. Besides, in this crystallizing step, a laser beam Lh with a wavelength selected as above is preferably used as a spot beam with a Gaussian beam profile.

By scanning of such a laser beam Lh, in the scanning path where the semiconductor film is fully melted, solidification proceeds concurrently with passage of the laser beam Lh, and crystal grains B' are formed in the state of being arrayed along the scanning center φ of the laser beam Lh. In this case, with the laser beam Lh set in a Gaussian shape, the temperature of the portion irradiated with the laser beam Lh is the highest at the scanning center φ of the laser beam Lh and the lowest at both ends, corresponding to the Gaussian beam profile of the laser beam Lh. Therefore, by conducting the irradiation while scanning the laser beam Lh in the scanning direction y, in the scanning path where the semiconductor thin film 5 is fully melted, solidification of crystal starts from the farthest positions from the scanning center φ (from both side ends of the scanning path of the laser beam), and certain numbers of seeds of crystal are generated at both side ends of the scanning path. With a further progress of the scanning of the laser beam Lh, solidification proceeds toward the scanning center φ and in the scanning direction y, and the solidification proceeds in the manner wherein the seeds B' of crystal are pulled to the scanning center φ and in the scanning direction y, so that the scanning center φ is crystallized lastly. In this case, the scanning speed and the output of the laser beam Lh may be controlled within the above-mentioned irradiation conditions so that the solidifications meet at the scanning center φ. As a result, crystal grains B' in a semi-crescent shape (i.e., a shape obtained by bisecting a crescent shape by a line ensuring line symmetry) gradually broadening from the scanning center φ toward each of both sides of the scanning path are obtained.

Besides, in this case, the width W1 of the crystal grain B' in the scanning direction y of the laser beam Lh is controlled by the irradiation conditions of the laser beam Lh mentioned above. Here, it is important to control the width W1 of the crystal grain B' in the scanning direction y becomes the period (predetermined pitch P') of grain boundaries a. Therefore, the above-mentioned irradiation conditions of the laser beam Lh, such as the wavelength of the laser beam Lh, the numerical aperture NA of an objective lens used for irradiation with the laser beam Lh, and the scanning speed and irradiation energy of the laser beam Lh, within such ranges that the semiconductor thin film is fully melted in the depth direction thereof by irradiation with the laser beam Lh and that the crystal grains B' have a predetermined width W1=P'.

Figure 12B:
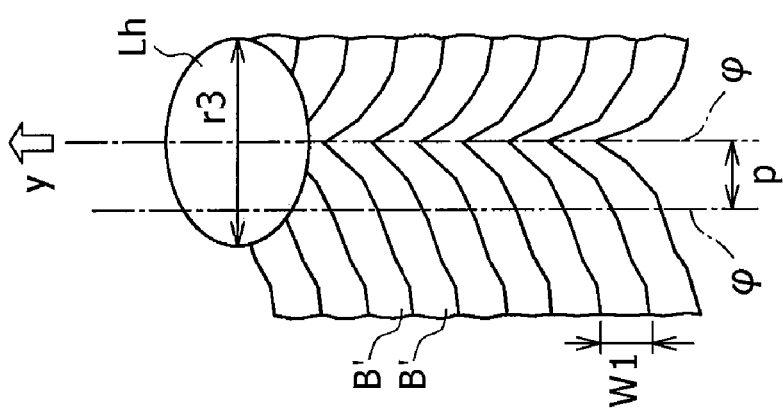

Next, as shown in FIG. 12B, the scanning path of the laser beam Lh is shifted by a predetermined pitch p, in relation to the scanning path in the previous irradiation, and the second run of scanning of the laser beam Lh is conducted. In this case, the scanning direction y of the laser beam Lh is a fixed direction parallel to that in the first run of scanning. Besides, the pitch p of the laser beam Lh scanned in parallel (the shift width of the scanning path) is not more than the diameter (the irradiation diameter in the direction perpendicular to the scanning direction y) r3 of the laser beam Lh. As a result, the solidification upon the second run of scanning of the laser beam Lh is made to proceed in the manner of succeeding to the crystallinity of the crystal grains B' formed at the adjacent scanning position of the laser beam Lh, and the crystal grains B' are grown in a direction different from the scanning direction y of the laser beam Lh (in a direction substantially perpendicular to the scanning direction y).

Besides, in this case, the pitch p of the laser beams Lh scanned in parallel is preferably not more than the irradiation radius (r3/2) of the laser beam Lh. This makes it easy to control the growth direction of the crystal grains B' to a fixed direction. As above-mentioned, when the laser beam Lh with the Gaussian beam profile is scanned, solidification proceeds in the scanning direction y and from both ends of the scanning path toward the scanning center φ side, whereby the crystal grains B' shaped in line symmetry with respect to the scanning center φ are formed. Therefore, by setting the pitch p of the laser beams Lh to be not more than the irradiation radius (r3/2) of the laser beam Lh, crystallization is made to proceed, leaving the portions of the crystal grains B' of which the solidification has proceeded in the scanning direction y and from one end side of the scanning path toward the scanning center φ side. Accordingly, it is easy to control the growth direction of the crystal grains B' to a fixed direction. For example, in the case of growing the crystal grains B' with a width W1 of several hundreds of nanometers while keeping the width W1, a laser beam Lh having a spot shape with a irradiation radius r of 200 to 500 nm is scanned while shifting the scanning path at a pitch p of not more than the irradiation radius (r3/2).

Figure 12C:
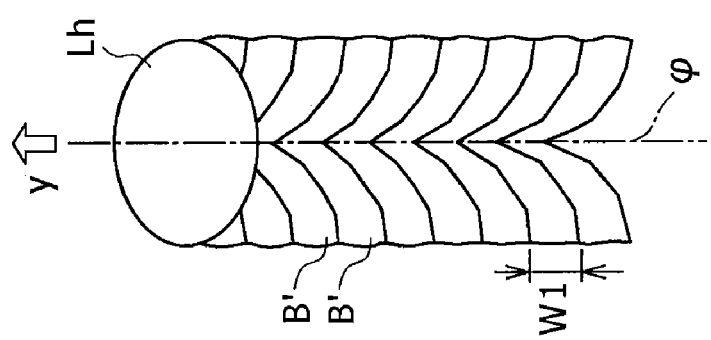

Thereafter, as shown in FIG. 12C, the third and latter runs of scanning of the laser beam Lh are sequentially conducted at respectively shifted positions, while shifting the scanning path at a predetermined pitch p. By this, the growth of the crystal grains B' in a direction different from the scanning direction y of the laser beam Lh is made to proceed further, to form belt-shaped crystal grains B extended in belt shape in a direction substantially perpendicular to the scanning direction. In this case, the scanning of the laser beam Lh at each position is conducted under the same irradiation conditions as in the first run of scanning, whereby the width W1 of the belt-shaped crystal grains B in the scanning direction is kept constant. Besides, with the belt-shaped crystal grains B arrayed in the scanning direction y, a crystalline region in which the grain boundaries a are provided periodically with a width W1 is formed. In other words, the grain boundaries a are periodically provided at a predetermined pitch P' equal to the width W1 of the belt-shaped crystal grains B.

Here, the width W1 of the belt-shaped crystal grains B (i.e., the pitch P' of the grain boundaries a) plays the role of an important factor in determining the number of the grain boundaries a provided in the channel part of the thin film semiconductor device, in the same manner as in the above-described embodiments.

Other than the above-described crystallization, there is a procedure of crystallization such that a continuous belt-shaped crystal grain B is formed between grain boundaries a, as shown in FIG. 4B. In this method, for example, pulsed irradiation is conducted while moving a line-shaped laser beam at a period P in the minor axis direction of the line shape. Even by such a method, with the line shapes of the laser beams set to partly overlap with each other, it is possible to form a grain boundary a at a portion irradiated overlappingly with the laser beams. In this case, with the minor axis direction of the line shape set in the channel length L direction, grain boundaries are provided periodically along the channel length L direction. Besides, this method is an example of a method of performing polycrystallization while extending grain boundaries in a direction different from the moving direction of an energy beam, by moving the irradiation position of the energy beam in a predetermined moving direction at a predetermined pitch within such a range that the former and latter energy beams overlap with each other, as set forth in the claims.

<Manufacturing Method of Display>

The manufacture of the liquid crystal display described referring to FIGS. 1 and 2, as a display provided with the above-described thin film transistors Tr1 and Tr2, is carried out as follows.

First, as shown in FIG. 8A, a semiconductor thin film 5 is formed on a first substrate 103, and the above-mentioned crystallization is applied to the semiconductor thin film 5 on a display region 103a and a peripheral region 103b. In this case, crystallization using a semiconductor laser oscillator is preferably conducted, whereby crystallizations by irradiation with different laser beams are applied to the regions.

Thereafter, the display region 103a and the peripheral region 103b on the first substrate 103 are subjected simultaneously to the step described referring to FIG. 8C and the subsequent step described referring to FIG. 8D, whereby the thin film transistors Tr1, Tr2 are formed on the first substrate 103.

Figure 13A:
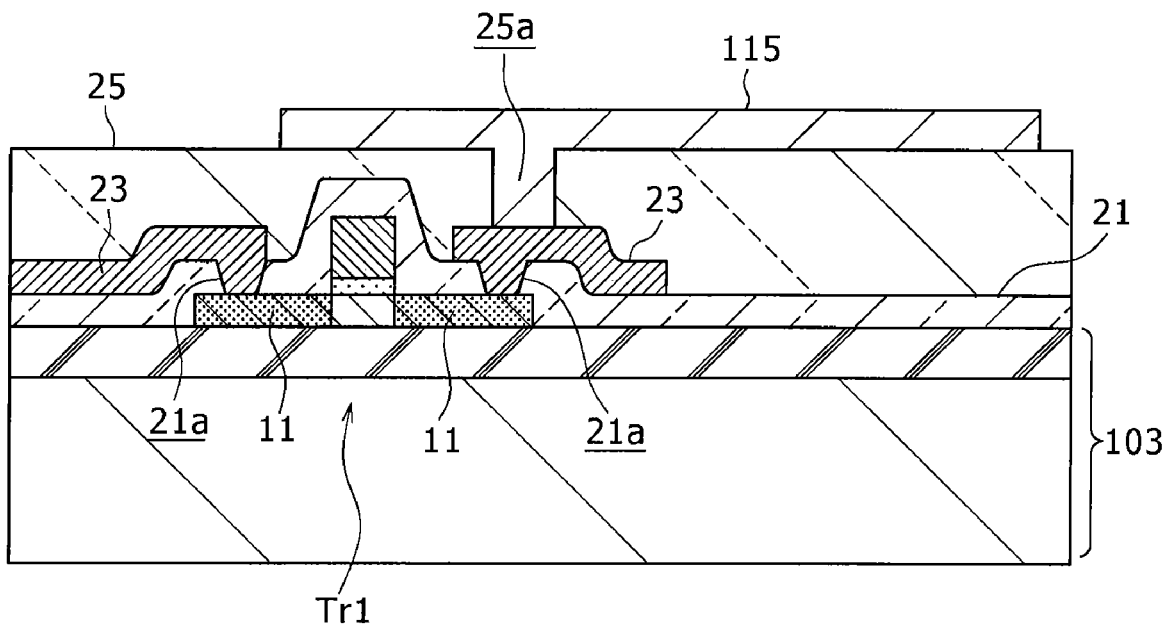
FIGS. 13A and 13B are manufacturing step diagrams of a display.

Then, as shown in FIG. 13A, a layer insulating film 21 is formed in the state of covering the thin film transistors Tr1

(Tr2). Next, the layer insulating film 21 is provided with through-holes 21a reaching the source/drains 11 of the thin film transistors Tr1 (Tr2). Then, wirings 23 connected to the source/drains 11 through the through-holes 21a are formed on the layer insulating film 21. Incidentally, other necessary circuit members such as capacity devices and wiring patterns are formed by the same steps as above-mentioned.

Next, a flattening insulating film 25 is formed in the state of covering the wirings 23, and through-holes 25a reaching the wirings 23 are formed in the flattening insulating film 25. Subsequently, pixel electrodes 115 connected to the source/drains 11 of the thin film transistors Tr1 in the display region 103a through the through-holes 25a and the wirings 23 are formed on the flattening insulating film 25. The pixel electrodes 115 are formed as transparent electrodes or as reflecting electrodes, depending on the display type of the liquid crystal display. Incidentally, FIG. 13(1) is a sectional view of an essential part of one pixel in the display region.

Thereafter, though not shown in the figure here, an orientation film covering the pixel electrodes 115 is formed over the flattening insulating film 25, to complete the first substrate 103 as a driving substrate.

Figure 13B:
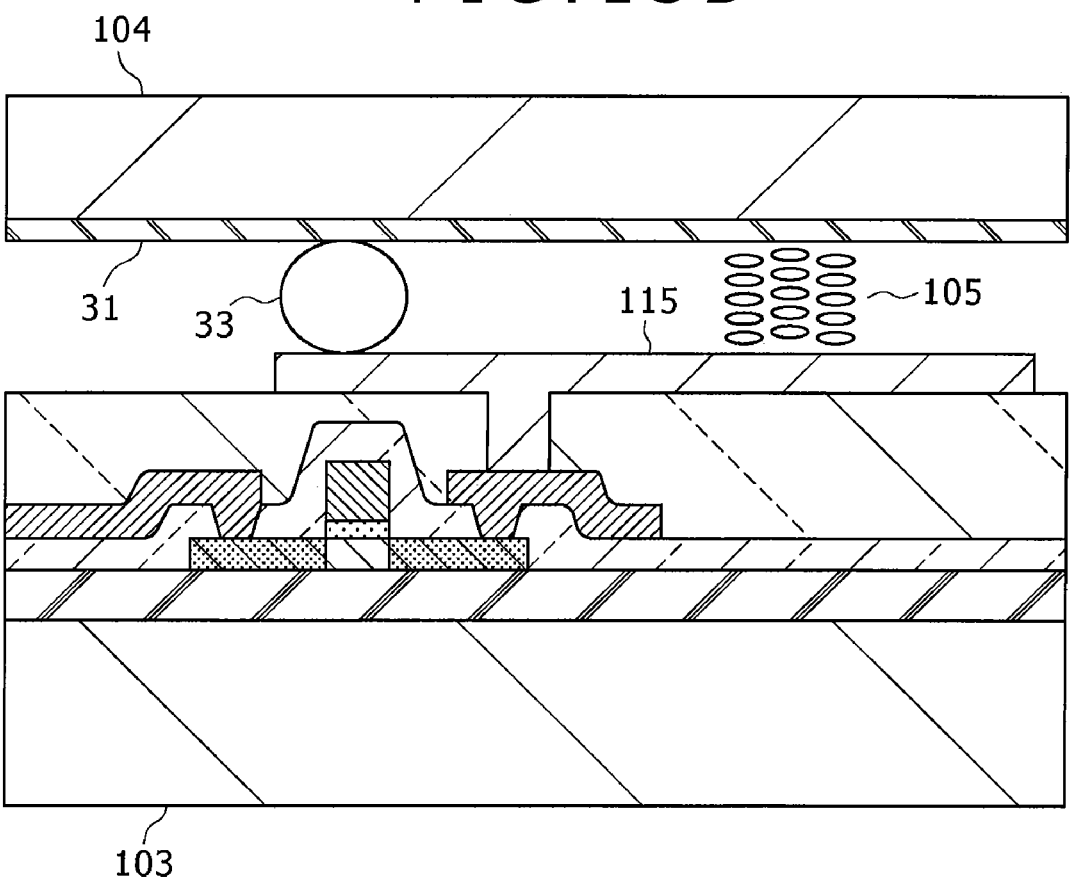

On the other hand, as shown in FIG. 13B, a second substrate 104 to be disposed opposite to the first substrate (driving substrate) 103 is prepared. A common electrode 31 is provided over the second substrate 104, and the common electrode 31 is covered by an orientation film omitted in the figure. Incidentally, the common electrode 31 is composed of a transparent electrode.

Then, the first substrate (driving substrate) 103 and the second substrate (counter substrate) 104 are disposed opposite to each other with spacers 33 therebetween, in the condition where the pixel electrodes 115 and the common electrodes 31 face each other. Then, the space between the substrates 103 and 104 kept at a predetermined spacing by the spacers 33 is filled with a liquid crystal phase 105, followed by sealing, whereby the display 1 is completed.

According to the display 1 of this embodiment as above-described, in the thin film transistor Tr1 for driving the pixel electrode, provided in the display region 103a, the grain boundaries a extended along the gate electrode 9 cross the channel part C and are periodically arranged in the channel length L direction, as shown in FIG. 4A. This configuration ensures that the carriers passing through the channel part C are necessarily moved crossing the grain boundaries a arranged periodically. Therefore, by controlling the period P of the grain boundaries, the transistor characteristics (carrier mobility) of the thin film transistors TFT in the thin film semiconductor device 1 can be controlled with good accuracy. Specifically, by making uniform the sizes of the periods P and the numbers of the grain boundaries a disposed in the channel parts C, the dispersion of carrier mobility among a plurality of devices can be suppressed.

Moreover, in a configuration in which crystal grains b sized to fully range between the grain boundaries a-a are arrayed along the grain boundaries a, the channel part C does not include any amorphous region, whereby deterioration of the device characteristics can be restrained. In addition, between the grain boundaries a-a, the carriers never pass through the grain boundary between the crystal grains b-b, so that the carrier mobility in the channel length L direction is kept high.

Since the period P of the grain boundaries a can be favorably controlled by irradiation conditions of the laser beam Lh as above-mentioned, it is possible to form thin film transistors TFT of which the transistor characteristics are controlled with good accuracy.

Therefore, by configuring the display 1 by use of such thin film transistors TFT as switching elements for pixels, it is possible to enhance the performance of the display 1 and to prevent color irregularities from being generated in the display part.

Moreover, in the thin film transistors Tr2 for peripheral circuitry, provided in the peripheral region 103b, particularly, the crystal state between the grain boundaries a-a is composed of the same belt-shaped crystal grains B, as shown in FIG. 4B. Therefore, the carrier mobility in the channel length L direction in the thin film transistors Tr2 can be kept higher than that of the thin film transistors Tr1 provided in the display region 103a.

Accordingly, by configuring the peripheral circuitry of the display 1 by use of such thin film transistors Tr2, display with higher performance can be achieved.

Incidentally, description has been made of the configuration in which an embodiment is applied to a liquid crystal display. However, the display according to the present embodiments is widely applicable to displays of the active matrix type in which thin film transistors are provided as switching elements for pixel electrodes, and promises the same or equivalent effects. For example, where the present embodiment is applied to an active matrix type organic EL display, the configuration of the driving circuits for the pixel electrodes using the thin film transistors Tr1 is modified, and a configuration may be satisfactorily adopted in which organic layers having the necessary functions such as a hole injection layer, a light emitting layer, and an electron transfer layer are formed over the pixel electrodes, and a common electrode is formed as a cathode (or anode) over the organic layers. In such an organic EL display, the problem of display irregularities is particularly serious, and, therefore, application of the present embodiment is a very effective means for enhancing the picture quality.

[EXAMPLES]

<Example 1>

Crystallization for use for thin film transistors in a display region was conducted.

First, a semiconductor thin film composed of amorphous silicon in a thickness of 50 nm was formed on an insulating substrate by the PE-CVD process.

Next, active regions of the semiconductor thin film were subjected to a crystallizing step for polycrystallization by irradiation with a laser beam Lh. Here, referring to FIG. 9A, the crystallizing step for the semiconductor thin film was carried out under the following conditions.

Spot diameter r1 in channel length L direction=500 nm
Spot diameter in scanning direction y=300 nm
Effective NA of objective lens=0.6
Moving pitch p1 in channel length L direction=400 nm
Scanning speed vt in scanning direction y=3 m/second
Irradiation energy on substrate≈15 mW Incidentally, the irradiation of the semiconductor thin film with the laser beam Lh was carried out by constantly applying a focus servo so that the focus would not be deviated at the time of scanning at high speed. In addition, part of the irradiating beam was monitored so that the irradiation energy was constant, whereby energy variations were obviated.

The region thus crystallized by irradiation with the laser beam Lh was observed under a scanning electron microscope (SEM). It was confirmed that a polycrystalline region in which uniformly crescent-shaped crystal grains b convex in the scanning direction y are regularly arrayed had been obtained between continuous grain boundaries a-a provided at a period P=400 nm.

<Example 2>

Crystallization for use for thin film transistors Tr1 in a display region was conducted.

First, a semiconductor thin film composed of amorphous silicon in a thickness of 50 nm was formed on an insulating substrate by the PE-CVD process. Next, for removing excess hydrogen ions from the inside of the semiconductor thin film, an annealing treatment (dehydrogenation annealing treatment) was carried out at 500° C. in vacuum for an hour.

Subsequently, active regions of the semiconductor thin film were subjected to a crystallizing step for polycrystallization by irradiation with a laser beam Lh. Here, referring to FIG. 9B, the crystallizing step for the semiconductor thin film was carried out under the following conditions.

Spot diameter r2 in channel length L direction=about 500 nm, circular
    Effective NA of objective lens=0.8
    Moving pitch p2 in channel length L direction=400 nm
    Scanning speed vt in scanning direction y=1 m/second
    Irradiation energy on substrate≈12 mW Incidentally, the irradiation of the semiconductor thin film with the laser beam Lh was carried out by constantly applying a focus servo so that the focus would not be deviated at the time of scanning at high speed. In addition, part of the irradiating beam was monitored so that the irradiation energy was constant, whereby energy variations were obviated.

The region thus crystallized by irradiation with the laser beam Lh was observed under a scanning electron microscope (SEM). It was confirmed that a polycrystalline region in which uniformly crescent-shaped crystal grains b convex in a direction opposite to the scanning direction y are regularly arrayed had been obtained between continuous grain boundaries a-a provided at a period P=400 nm.

<Example 3>

Crystallization for use for thin film transistors Tr1 in a display region was conducted.

First, a semiconductor thin film composed of amorphous silicon in a thickness of 50 nm which had been subjected to a dehydrogenation treatment was formed following the same procedure as in Example 2.

Next, active regions of the semiconductor thin film were subjected to a crystallizing step for polycrystallization by irradiation with a laser beam Lh. Here, referring to FIG. 9B in the same manner as in Example 2, the crystallizing step for the semiconductor thin film was carried out under the following conditions.

Spot diameter r2 in channel length L direction=about 500 nm, circular
    Effective NA of objective lens=0.4
    Moving pitch p2 in channel length L direction=600 nm
    Scanning speed vt in scanning direction y=3 m/second
    Irradiation energy on substrate≈12 mW Incidentally, the irradiation of the semiconductor thin film with the laser beam Lh was carried out by constantly applying a focus servo so that the focus would not be deviated at the time of scanning at high speed. In addition, part of the irradiating beam was monitored so that the irradiation energy was constant, whereby energy variations were obviated.

The region thus crystallized by irradiation with the laser beam Lh was observed under a scanning electron microscope (SEM). It was confirmed that a polycrystalline region in which uniformly crescent-shaped crystal grains b convex in a direction opposite to the scanning direction y are regularly arrayed had been obtained between continuous grain boundaries a-a provided at a period P=600 nm.

<Example 4>

Crystallization for use for thin film transistors Tr2 in a peripheral region was conducted.

First, a semiconductor thin film composed of amorphous silicon in a thickness of 50 nm which had been subjected to a dehydrogenation treatment was formed following the same procedure as in Example 2.

Next, active regions of the semiconductor thin film were subjected to a crystallizing step for polycrystallization by irradiation with a laser beam Lh. Here, referring to FIGS. 12A to 12C, the crystallizing step for the semiconductor thin film was carried out under the following conditions.

Spot diameter r3 in channel length L direction=about 500 nm, circular
    Effective NA of objective lens=0.8
    Moving pitch p in direction orthogonal to channel length L direction=100 nm
    Scanning speed vt in scanning direction y (channel length L direction)=1 m/second
    Irradiation energy on substrate≈12 mW Incidentally, the irradiation of the semiconductor thin film with the laser beam Lh was carried out by constantly applying a focus servo so that the focus would not be deviated at the time of scanning at high speed. In addition, part of the irradiating beam was monitored so that the irradiation energy was constant, whereby energy variations were obviated.

The region thus crystallized by irradiation with the laser beam Lh was observed under a scanning electron microscope (SEM). It was confirmed that a polycrystalline region in which belt-shaped crystal grains B extended in a direction substantially perpendicular to the scanning direction y are regularly arrayed had been obtained. The width W1 of these belt-shaped crystal grains B (i.e., the period P' of grain boundaries a) was about 400 nm.

<Example 5>

Crystallization for use for thin film transistors Tr2 in a peripheral region was conducted.

The same procedure as in Example 4 was repeated, except that the irradiation conditions of the laser beam Lh were changed as follows.

Spot diameter r3 in channel length L direction=about 500 nm, circular
    Effective NA of objective lens=0.4
    Moving pitch p in direction orthogonal to channel length L direction=200 nm
    Scanning speed vt in scanning direction y (channel length L direction)=3 m/second
    Iradiation energy on substrate≈12 mW The region thus crystallized by irradiation with the laser beam Lh was observed under a scanning electron microscope (SEM). It was confirmed that a polycrystalline region in which belt-shaped crystal grains B extended in a direction substantially perpendicular to the scanning direction y are regularly arrayed had been obtained. The width W1 of these belt-shaped crystal grains B (i.e., the period P' of grain boundaries a) was about 200 nm.

<Examples 2-1 to 5-2>

In Examples 2-1, 2-2, 3-1, and 3-2, the thin film transistor Tr1 for the display region shown in FIG. 4A was fabricated by use of the region made to be polycrystalline as in Examples 2 and 3. On the other hand, in Examples 4-1, 4-2, 5-1, and 5-2, the thin film transistor Tr2 for the peripheral region shown in FIG. 4B was fabricated by use of the region made to be polycrystalline as in Examples 4 and 5.

In each of Examples 2-1 to 5-2, as shown in Table 1 below, the thin film transistor Tr1 or Tr2 with a channel length (gate line width) L of 10 or 20 μm and a channel width W of 50 μm was fabricated. In addition, as has been described referring to FIGS. 4A and 4B, a gate wiring 5 was provided in parallel to the grain boundaries a, in both of the thin film transistors Tr1 and Tr2. Incidentally, the numbers of the grain boundaries a in the channel parts of the thin film transistors in Examples 2-1 to 5-2 were as given in Table 1.

TABLE 1

|   |   | Numerical aperture NA | Channel Length L | Number of grain boundaries a (periods) | Dispersion of ON current ± σ | Dispersion of Vth | Mobility (cm²/Vs) |
|---|---|---|---|---|---|---|---|
| Tr1 FIG. 4A | Ex. 2-1 | 0.8 | 10 μm | 25 | ±1.9% | 0.08 V | 26 |
|  | Ex. 2-2 |  | 20 μm | 50 | ±1.3% | 0.06 V | 26 |
|  | Ex. 3-1 | 0.4 | 10 μm | 17 | ±0.94% | 0.10 V | 18 |
|  | Ex. 3-2 |  | 20 μm | 33 | ±0.56% | 0.06 V | 18 |
| Tr2 FIG. 4B | Ex. 4-1 | 0.8 | 10 μm | 25 | — | 0.29 V | 120 |
|  | Ex. 4-2 |  | 20 μm | 50 | — | 0.18 V | 155 |
|  | Ex. 5-1 | 0.4 | 10 μm | 50 | — | 0.10 V | 200 |
|  | Ex. 5-2 |  | 20 μm | 100 | — | 0.09 V | 210 |

Channel width W = 50 μm (Process improved when NA = 0.4)

For each of the thin film transistors fabricated as above, the dispersion of threshold Vth and the mobility of carriers were measured. In addition, for the thin film transistors Tr1 for the display region in Examples 2 and 3, the dispersion of ON current was measured. The results of these measurements are given together in Table 1. Incidentally, Examples and comparative examples were each carried out by an experimental process. Therefore, Examples 3 and 5 in which the effective NA of the objective lens was 0.4 include the results of an improvement in process (specifically, handleability), as compared with other examples.

From these results it was confirmed that in the thin film transistors Tr1 for the display region (Examples 2-1 to 3-2), as the number of the grain boundaries a is larger (as the number of the periods is larger), the dispersion ±σ of ON current and the dispersion σ of threshold Vth are smaller and the accuracy of characteristics is better, in the thin film transistors obtained. Particularly, it was confirmed that even in the case where the effective NA of the objective lens is 0.8 and the process is not improved (Example 2), the dispersion of ON current is suppressed to within 3% if the number of the grain boundaries a is about 25, and, even where this thin film transistor is used as switching elements for pixel electrodes in a display using organic EL devices, the dispersion of luminance is sufficiently suppressed to such a level as to be visually unrecognizable. It was also confirmed that even where the effective NA of the objective lens is as low as 0.4, the dispersion ±σ of ON current can be suppressed to a sufficiently low level, in the same manner as where effective NA is 0.8.

In addition, it was confirmed that in the thin film transistors Tr2 for the peripheral region (Examples 4-1 to 5-2), as the number of the grain boundaries is larger, the dispersion of Vth among the transistors is smaller and the accuracy of characteristics is better, in the thin film transistors obtained. Particularly, it was confirmed that even in the case where the effective NA is 0.8 and the process is not improved (Example 4), the dispersion of threshold Vth is suppressed to within 0.2 V if the number of the grain boundaries a is 50 or more, and the thin film transistors are extremely useful as switching elements to be disposed in a peripheral circuitry region with a high mobility. Moreover, it was confirmed that even where the effective NA of the objective lens is as low as 0.4, the dispersion σ of threshold Vth can be suppressed to a sufficiently low level, in the same manner as where the effective NA is 0.8.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display comprising:

a driving substrate; and a plurality of pixel electrodes and thin film transistors arrayed on the driving substrate, said thin film transistors driving said pixel electrodes, wherein each said thin film transistor includes a semiconductor thin film having an active region made to be polycrystalline by irradiation with an energy beam, and a gate electrode provided so as to cross said active region, and in a channel part of said active region overlapping with said gate electrode, a crystal state is varied periodically along a channel length region, and substantially the same crystal state crosses said channel part;

wherein an amorphous zone and a crystalline zone are alternately provided in the manner of crossing said active region, on a basis of a period pertaining to the variation in said crystal state, and wherein said crystalline zone, crystal grains are in a crescent shape convex in the extending direction of said crystalline zone and said crystal grains are sized to fully range in the width direction of said crystalline zone and said crystal grains are arrayed along said extending direction of said crystalline zone.

2. The display as set forth in claim 1, wherein said channel part of said thin film transistor is provided with grain boundaries in the manner of crossing said active region, on the basis of the period pertaining to the variation in said crystal state, and wherein between said grain boundaries, crystal grains in a crescent shape convex in the extending direction of said grain boundaries are arrayed along said extending direction of said grain boundaries.

3. The display as set forth in claim 1, wherein said channel part is provided with a predetermined number, not less than two, of periods pertaining to variation in said crystal state.

4. The display as set forth in claim 1, wherein a peripheral circuitry configured by use of thin film transistors is provided in the periphery of a display region in which said pixel electrodes and said driving thin film transistors are arrayed;

said transistors constituting said peripheral circuitry including a semiconductor thin film having an active region made to be polycrystalline by irradiation with an energy beam, and a gate electrode so provided as to cross said active region; and a channel part of said active region overlapping with said gate electrode is provided with belt-shaped crystal grains extending along said gate electrode in the manner of crossing said channel part, and said belt-shaped crystal grains are provided periodically along said channel length direction.

5. The display as set forth in claim 4, wherein said channel part of each of said thin film transistors constituting said peripheral circuitry is provided with grain boundaries of said belt-shaped crystal grains in a predetermined number, not less than two, of periods.

* * * * *